(12) United States Patent
Nakamura et al.

(10) Patent No.: US 11,211,558 B2
(45) Date of Patent: Dec. 28, 2021

(54) DEPOSITION MASK DEVICE AND METHOD OF MANUFACTURING DEPOSITION MASK DEVICE

(71) Applicant: Dai Nippon Printing Co., Ltd., Tokyo (JP)

(72) Inventors: Yusuke Nakamura, Tokyo (JP); Hideyuki Okamoto, Tokyo (JP); Masato Ushikusa, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/438,861

(22) Filed: Jun. 12, 2019

(65) Prior Publication Data

US 2019/0378984 A1    Dec. 12, 2019

Related U.S. Application Data

(63) Continuation of application No. PCT/JP2017/042297, filed on Nov. 24, 2017.

(30) Foreign Application Priority Data

Dec. 14, 2016   (JP) ............................. JP2016-242400
Nov. 17, 2017   (JP) ............................. JP2017-222064

(51) Int. Cl.
   *H01L 51/00*   (2006.01)
   *H01L 51/50*   (2006.01)
   (Continued)

(52) U.S. Cl.
   CPC ........ *H01L 51/0011* (2013.01); *C23C 14/042* (2013.01); *C23C 14/12* (2013.01);
   (Continued)

(58) Field of Classification Search
   None
   See application file for complete search history.

(56) References Cited

U.S. PATENT DOCUMENTS 4,964,828 A * 10/1990 Patt ........................ H01J 9/142
                                                        313/402
2002/0059903 A1   5/2002 Hasegawa et al.
(Continued)

FOREIGN PATENT DOCUMENTS

CN        1578563 A    2/2005
CN      102703857 A   10/2012
(Continued)

OTHER PUBLICATIONS

Taiwanese Office Action (Application No. 106143066) dated Aug. 7, 2020 (with English translation).
(Continued)

*Primary Examiner* — Karla A Moore
*Assistant Examiner* — Tiffany Z Nuckols
(74) *Attorney, Agent, or Firm* — Burr & Brown, PLLC

(57) ABSTRACT

A vapor deposition mask device includes a vapor deposition mask having an effective region in which a plurality of first through holes is disposed, and a frame attached to the vapor deposition mask. The vapor deposition mask device includes a plurality of joint portions that joins the vapor deposition mask and the frame to each other. The plurality of joint portions is arranged along the outer edge of the vapor deposition mask. A notch is formed at a position corresponding to between two adjacent joint portions in the outer edge of the vapor deposition mask.

5 Claims, 24 Drawing Sheets

(51) Int. Cl.
  *H01L 51/56* (2006.01)
  *C23F 1/02* (2006.01)
  *C23C 14/04* (2006.01)
  *C23C 14/12* (2006.01)

(52) U.S. Cl.
  CPC ............ *C23F 1/02* (2013.01); *H01L 51/0012* (2013.01); *H01L 51/0023* (2013.01); *H01L 51/5012* (2013.01); *H01L 51/56* (2013.01)

(56) References Cited

U.S. PATENT DOCUMENTS

| | | | |
|---|---|---|---|
| 2005/0019968 A1 | 1/2005 | Kuwahara et al. | |
| 2009/0297768 A1* | 12/2009 | Ko | B23K 31/02 428/136 |
| 2011/0265714 A1 | 11/2011 | Lee et al. | |
| 2012/0174862 A1* | 7/2012 | Lee | C23C 14/042 118/504 |
| 2013/0318774 A1* | 12/2013 | Kang | B05C 21/005 29/592 |
| 2016/0043319 A1* | 2/2016 | White | G02B 26/02 359/230 |
| 2016/0322571 A1* | 11/2016 | Lee | H01L 51/56 |
| 2019/0368025 A1* | 12/2019 | Kim | G03F 7/2063 |

FOREIGN PATENT DOCUMENTS

| | | |
|---|---|---|
| CN | 104846328 A | 8/2015 |
| CN | 105144421 A | 12/2015 |
| CN | 105568218 A | 5/2016 |
| JP | 2002-220656 A1 | 8/2002 |
| JP | 2003-272839 A1 | 9/2003 |
| JP | 2005-042133 A1 | 2/2005 |
| JP | 2005-158477 A1 | 6/2005 |
| JP | 2005-340138 A1 | 12/2005 |
| JP | 2006-114402 A1 | 4/2006 |
| JP | 2009-066082 A1 | 4/2009 |
| JP | 2009-068082 A1 | 4/2009 |
| JP | 2006-124761 A1 | 5/2016 |
| JP | 2016-521316 A1 | 7/2016 |
| JP | 2016-148112 A1 | 8/2016 |
| TW | 201510637 A | 3/2015 |
| TW | 201640220 A | 11/2016 |
| WO | 2016/129534 A1 | 8/2016 |

OTHER PUBLICATIONS

International Search Report and Written Opinion (Application No. PCT/JP2017/042297) dated Feb. 27, 2018.
Chinese Office Action (Application No. 201711228220.X) dated Jul. 15, 2019 (with English translation).
English translation of International Preliminary Report on Patentability (Chapter 1) (Application No. PCT/JP2017/042297) dated Jun. 27, 2019, 7 pages.
A Partial Supplementary European Search Report (Application No. 17881561.9) dated Jul. 10, 2020.
Extended European Search Report (Application No. 17881561.9) dated Oct. 12, 2020.
Chinese Office Action (Application No. 201911199123.1) dated May 24, 2021 (with English translation).
Japanese Office Action (Application No. 2017-222064) dated Jul. 30, 2021 (with English translation).
Chinese Office Action (Application No. 201911199123.1) dated Oct. 15, 2021 (with English translation).

* cited by examiner

DEPOSITION MASK DEVICE AND METHOD OF MANUFACTURING DEPOSITION MASK DEVICE

CROSS-REFERENCE TO RELATED APPLICATIONS

The present application is a continuation application of International Application No. PCT/JP2017/042297 filed on 24 Nov. 2017, which claims priority to Japanese Patent Application No. 2016-242400 filed on 14 Dec. 2016 and Japanese Patent Application No. 2017-222064 filed on 17 Nov. 2017. The contents of PCT/JP2017/042297, Japanese Patent Application No. 2016-242400 and Japanese Patent Application No. 2017-222064 are incorporated herein by reference in their entirety.

TECHNICAL FIELD

The present disclosure relates to a vapor deposition mask device used for vapor deposition of a vapor deposition material on a substrate to be vapor-deposited and a method of manufacturing the vapor deposition mask device.

BACKGROUND ART

In recent years, high definition for display devices used in portable devices such as smartphones and tablet PCs, is required, for example, the pixel density with 400 ppi or more is required. There is a growing demand for ultra-high-vision in portable devices. In this case, the pixel density of the display device is required to be, for example, 800 ppi or more.

Among display devices, organic EL display devices have attracted attention because of their high responsiveness, low power consumption, and high contrast. As a method of forming the pixels of the organic EL display device, the method of forming pixels in a desired pattern is known in which a vapor deposition mask including through holes arranged in a desired pattern is used. Specifically, an evaporation process is performed in which first, the substrate (organic EL substrate) for the organic EL display device is put into the vapor deposition apparatus, next, the vapor deposition mask is brought into close contact with the organic EL substrate in the vapor deposition apparatus, and the organic material is vapor-deposited on the organic EL substrate.

When a vapor deposition material is deposited on a substrate to be vapor-deposited using a vapor deposition mask, the vapor deposition material adheres not only to the substrate but also to the vapor deposition mask. For example, some of the vapor deposition materials are directed to the substrate to be vapor-deposited along a direction greatly inclined with respect to the normal direction to the plate face of the vapor deposition mask. Such a vapor deposition material may reach and adhere to the wall face of the through hole of the vapor deposition mask before reaching the substrate to be vapor-deposited. In this case, the vapor deposition material is less likely to adhere to the region located in the vicinity of the wall face of the through hole of the vapor deposition mask of the substrate to be vapor-deposited. As a result, it is conceivable that the thickness of the vapor deposition material that adheres to the region may be smaller than a thickness for other parts, or a portion to which the vapor deposition material is not attached may be generated. That is, it is conceivable that the vapor deposition in the vicinity of the wall face of the through hole of the vapor deposition mask is unstable. Therefore, when a vapor deposition mask is used to form the pixels of the organic EL display device, dimensional accuracy and positional accuracy of the pixels will be degraded. As a result, the luminous efficiency of the organic EL display device is reduced.

An example of a vapor deposition mask that can solve such a problem is a vapor deposition mask as disclosed in JP 2016-148112 A. The vapor deposition mask disclosed in JP 2016-148112 A is manufactured using a plating treatment. First, a conductive pattern is formed on an insulating substrate, and then a first metal layer is formed on the conductive pattern using electrolytic plating. Next, a resist pattern having an opening is formed on the first metal layer, and a second metal layer is formed in the opening using electrolytic plating. Thereafter, the resist pattern, the conductive pattern and the substrate are removed to obtain a vapor deposition mask having the first metal layer and the second metal layer.

In the technology disclosed in JP 2016-148112 A, the vapor deposition mask is manufactured using plating treatment, so that there is an advantage that a thinned vapor deposition mask can be obtained. According to the thinned vapor deposition mask, it is possible to reduce the proportion of the vapor deposition material that reaches and adheres to the wall face of the through hole of the vapor deposition mask to vapor deposition materials directed toward the substrate to be vapor-deposited from a direction greatly inclined with respect to the normal direction to the plate face of the vapor deposition mask. That is, the vapor deposition material directed toward the substrate to be vapor-deposited from the direction greatly inclined with respect to the normal direction to the plate face of the vapor deposition mask can be appropriately attached onto the substrate to be vapor-deposited exposed in the through holes of the vapor deposition mask. Therefore, when a vapor deposition mask is used to form a pixel of an organic EL display device, there is an advantage that it is possible to effectively suppress the reduction in the light emission efficiency of the organic EL display device due to the decrease in the dimensional accuracy and the positional accuracy of the pixel.

In the technology disclosed in JP 2016-148112 A, after manufacturing the vapor deposition mask using plating treatment, the vapor deposition mask is attached to a frame to manufacture a vapor deposition mask device. At this time, the frame of the vapor deposition mask device holds the vapor deposition mask in a stretched state. That is, tension is applied to the vapor deposition mask in the state of being fixed to the frame. As a result, the occurrence of bending in the vapor deposition mask is suppressed. However, it was found that the tension applied to the thinned vapor deposition mask causes the vapor deposition mask to be wrinkled or deformed.

In the technology disclosed in JP 2016-148112 A, a vapor deposition mask is manufactured from a metal layer by peeling off the metal layer from the substrate after forming the metal layer on the substrate by plating treatment. In this case, when peeling off the metal layer from the substrate, the tension applied to the metal layer locally causes high stress, which may cause wrinkles or deformation in the peeled vapor deposition mask.

SUMMARY

The present disclosure has been made in consideration of these points. It is an object of the present disclosure to provide a vapor deposition mask device capable of suppressing the occurrence of wrinkles and deformation in a vapor deposition mask, and a method of manufacturing the vapor deposition mask device.

A vapor deposition mask device of the present disclosure includes a vapor deposition mask having an effective region in which a plurality of first through holes is arranged, and a frame attached to the vapor deposition mask. The vapor deposition mask device includes a plurality of joint portions which joins the vapor deposition mask and the frame to each other. The plurality of joint portions is arranged along an outer edge of the vapor deposition mask. A notch is formed, in the outer edge of the vapor deposition mask, at a position corresponding to between two of the joint portions which are adjacent.

A vapor deposition mask device of the present disclosure includes a vapor deposition mask having an effective region in which a plurality of first through holes is disposed, and a frame attached to the vapor deposition mask. The vapor deposition mask device includes a plurality of joint portions that joins the vapor deposition mask and the frame to each other. The plurality of joint portions is arranged along an outer edge of the vapor deposition mask. The vapor deposition mask has, between the plurality of joint portions and the effective region, a plurality of second through holes overlapping an inner edge of the frame in plan view. Each of the second through holes is disposed at a position corresponding to between two of the joint portions which are adjacent.

A method of manufacturing a vapor deposition mask device of the present disclosure includes a vapor deposition mask having an effective region in which a plurality of first through holes is arranged, and a frame attached to the vapor deposition mask. The method includes a joining step of joining, to the frame, a metal layer of a laminate including a base material, a conductive pattern provided on the base material, and the metal layer provided on opposite side, with respect to the base material, of the conductive pattern by a plurality of joint portions; and a separation step of etching away the conductive pattern to separate the base material from the metal layer, and forming the vapor deposition mask from the metal layer.

Advantageous Effects

According to the disclosure, it is possible to provide a vapor deposition mask device capable of suppressing the occurrence of wrinkles and deformation in the vapor deposition mask and a method of manufacturing the vapor deposition mask device.

DESCRIPTION OF EMBODIMENTS

Figure 1:
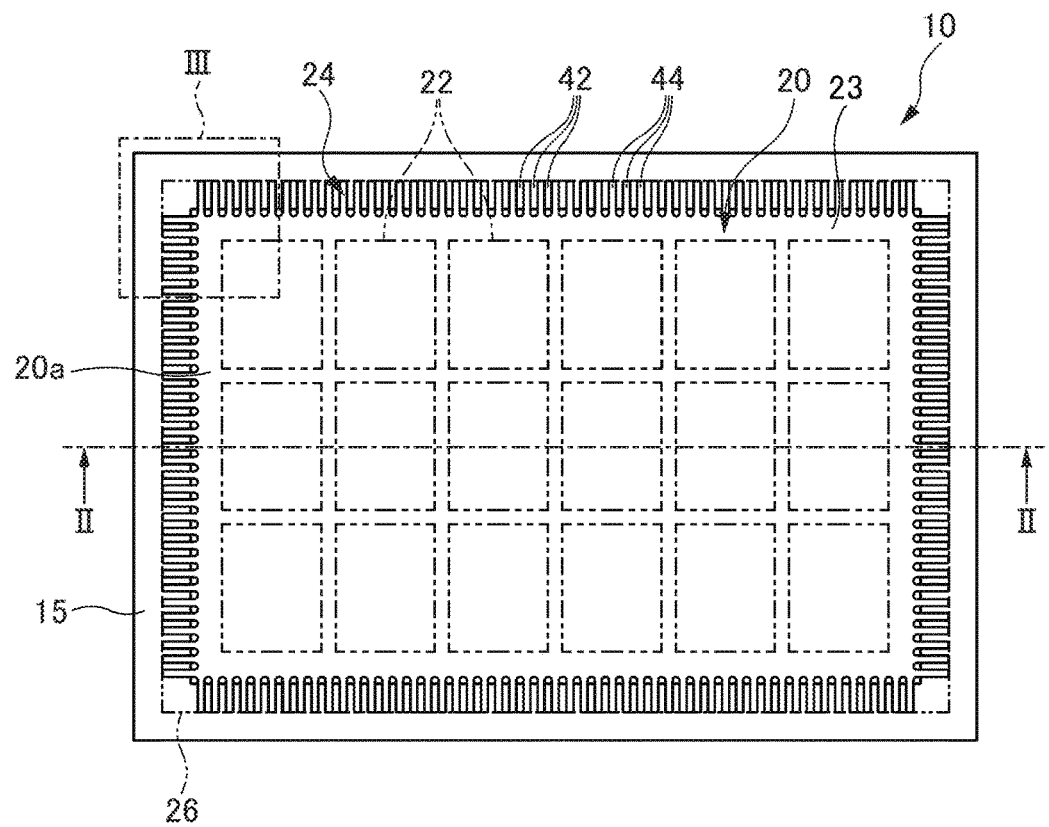
FIG. 1 is a diagram for explaining an embodiment of the present disclosure, and is a plan view schematically showing an example of a vapor deposition mask device.

Hereinafter, an embodiment of the present disclosure will be described with reference to the drawings. In the drawings attached to the present specification, for convenience of ease of understanding and ease of illustration, scale ratios, longitudinal and lateral dimensional ratios and the like are exaggerated by changing from the actual ones.

FIGS. 1 to 46 are diagrams for explaining an embodiment according to the present disclosure. In the following embodiment, a vapor deposition mask device used to pattern an organic material on a substrate in a desired pattern when manufacturing an organic EL display device and a method of manufacturing the vapor deposition mask device will be described as an example. However, without being limited to such an application, the present disclosure can be applied to a vapor deposition mask device used for various applications and a method of manufacturing the vapor deposition mask device.

In the present specification, the terms "plate", "sheet" and "film" are based only on the difference in organizational designations and are not distinguished from each other. For example, the "plate" has a concept including a member that may be called a sheet or a film.

The term "plate face (sheet face, film face)" refers to a plane that coincides with the planar direction of a target plate-like member (sheet-like member, film-like member) in a case where the target plate-like member (sheet-like member, film-like member) is viewed as a whole and generally. The normal direction used for a plate-like (sheet-like, film-like) member refers to a normal direction to the plate face (sheet face, film face) of the member.

In the present specification, the term "in plan view" refers to a state in which a target plate-like (sheet-like, film-like) member is viewed from the normal direction of the member. For example, a plate-like member "having a rectangular shape in plan view" refers to the member having a rectangular shape when the member is viewed from the normal direction to the plate face.

Further, terms such as "parallel", "orthogonal", "same", "equivalent", and the like, values of length and angle, physical properties, and the like which specify shapes and geometrical conditions, physical properties, and their degrees to be used in this specification are interpreted including a range in which these terms can be expected to have similar functions without being bound by a strict meaning.

First, an example of a vapor deposition mask device 10 will be described with reference to FIGS. 1 and 2. Here, FIG. 1 is a plan view of an example of the vapor deposition mask device 10, and FIG. 2 is a diagram showing the usage method of the vapor deposition mask device 10 shown in FIG. 1.

Figure 2:
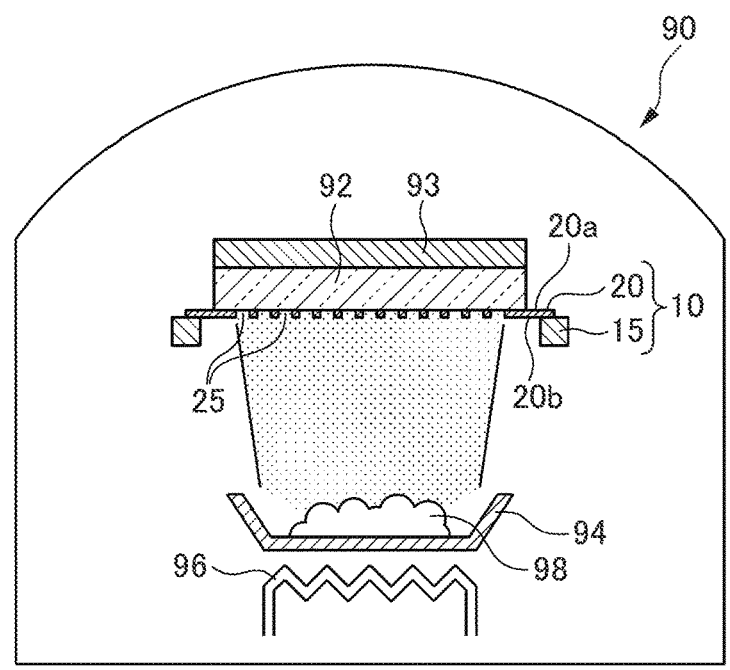
FIG. 2 is a diagram for explaining a vapor deposition method using the vapor deposition mask device shown in FIG. 1.

The vapor deposition mask device 10 shown in FIGS. 1 and 2 includes a vapor deposition mask 20 having a substantially rectangular shape in plan view and a frame 15 attached to the periphery of the vapor deposition mask 20. The vapor deposition mask 20 has an effective region 22 in which a plurality of first through holes 25 is formed, and an ear region 24 located at the periphery of the vapor deposition mask 20, and is attached to the frame 15 at the ear region 24. In the example shown in FIG. 1 the frame 15 is formed in a substantially rectangular frame shape, and the vapor deposition mask 20 having a substantially rectangular shape is attached to the frame 15 such that each side of the vapor deposition mask 20 corresponds to each side of the frame 15.

In the effective region 22, when depositing a vapor deposition material 98 (For example, an organic light emitting material) to a substrate to be vapor-deposited which is a work to be vapor-deposited (For example, an organic EL substrate 92), a plurality of first through holes 25 through which the vapor deposition material 98 is intended to pass is formed in a desired pattern. In this vapor deposition mask device 10 is, as shown in FIG. 2, the vapor deposition mask 20 is supported in the vapor deposition apparatus 90 such that a first face 20a of the vapor deposition mask 20 faces the lower face of the substrate to be vapor-deposited, and is used for the vapor deposition of vapor deposition material 98 to a substrate to be vapor-deposited.

In the vapor deposition apparatus 90, a magnet 93 is disposed on the face (upper face in FIG. 2) of the organic EL substrate 92 opposite the vapor deposition mask 20. As a result, the vapor deposition mask 20 is attracted to the magnet 93 by the magnetic force from the magnet 93 and comes into close contact with the organic EL substrate 92. In the vapor deposition apparatus 90, a crucible 94 that accommodates the vapor deposition material 98 and a heater 96 that heats the crucible 94 are disposed below the vapor deposition mask device 10. The vapor deposition material 98 in the crucible 94 is vaporized or sublimated by the heat from the heater 96 and adheres to the face of the organic EL substrate 92. As mentioned above, a large number of first through holes 25 are formed in the vapor deposition mask 20, and the vapor deposition material 98 adheres to the organic EL substrate 92 through the first through holes 25. As a result, the vapor deposition material 98 is deposited on the surface of the organic EL substrate 92 in a desired pattern corresponding to the position of the first through holes 25 of the vapor deposition mask 20.

As described above, in the present embodiment, the first through holes 25 are arranged in the effective region 22 in a predetermined pattern. When it is desired to display color with plurality of colors, for example, a plurality of vapor deposition machines on which the vapor deposition mask devices 10 corresponding to respective colors are mounted is prepared, and the organic EL substrate 92 is sequentially put into each vapor deposition machine. As a result, for example, the organic light emitting material for red, the organic light emitting material for green, and the organic light emitting material for blue can be sequentially deposited on the organic EL substrate 92.

The vapor deposition process may be performed inside the vapor deposition apparatus 90 where the inside has a high temperature atmosphere. In this case, the vapor deposition mask device 10 and the organic EL substrate 92 held inside the vapor deposition apparatus 90 are also heated during the vapor deposition process. At this time, the vapor deposition mask device 10 and the organic EL substrate 92 exhibit behavior of dimensional change based on their respective thermal expansion coefficients. In this case, when the thermal expansion coefficients of the vapor deposition mask device 10 and the organic EL substrate 92 are largely different, the positional deviation due to the difference in the dimensional change occurs, and as a result, the dimensional accuracy and the positional accuracy of the vapor deposition material 98 deposited on the organic EL substrate 92 deteriorate. In order to solve such a problem, it is preferable that the thermal expansion coefficients of the vapor deposition mask 20 and the frame 15 that constitute the vapor deposition mask device 10 have values equivalent to the thermal expansion coefficient of the organic EL substrate 92. For example, when a glass substrate is used as the organic EL substrate 92, an iron alloy containing nickel can be used as a main material of the vapor deposition mask 20 and the frame 15. For example, an iron alloy such as an invar material containing 34 mass % or more and 38 mass % or less of nickel, or a super-invar material containing cobalt in addition to nickel can be used as a material of a first metal layer 32 and a second metal layer 37, to be described later, which constitute the vapor deposition mask 20.

During the deposition process, when the temperatures of the vapor deposition mask device 10 and the organic EL substrate 92 do not reach high temperatures, the thermal expansion coefficients of the vapor deposition mask 20 and the frame 15 that constitute the vapor deposition mask device 10 do not have to be particularly equal to the thermal expansion coefficient of the organic EL substrate 92. In this case, as a material of the first metal layer 32 and the second metal layer 37 or an ear metal layer 38, to be described later, which constitute the vapor deposition mask 20, materials other than the above-described iron alloys may be used. For example, iron alloys other than iron alloys containing nickel described above, such as iron alloys containing chromium, may be used. As an iron alloy containing chromium, for example, an iron alloy referred to as a so-called stainless steel can be used. Alloys such as nickel and nickel-cobalt alloys, which are other than iron alloys, may be used.

Figure 3:
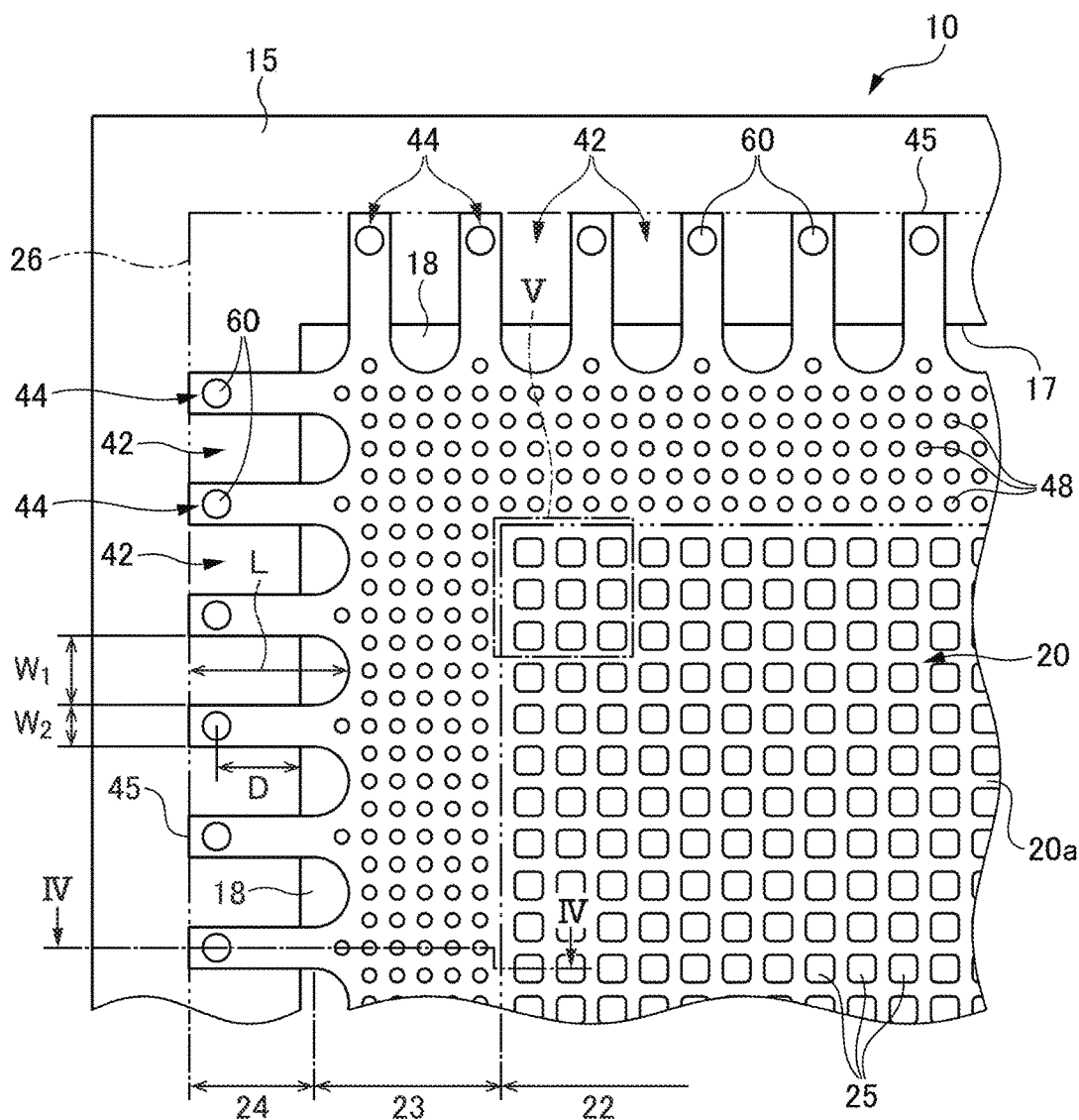
FIG. 3 is a partial plan view of the vapor deposition mask device shown in FIG. 1.
Figure 4:
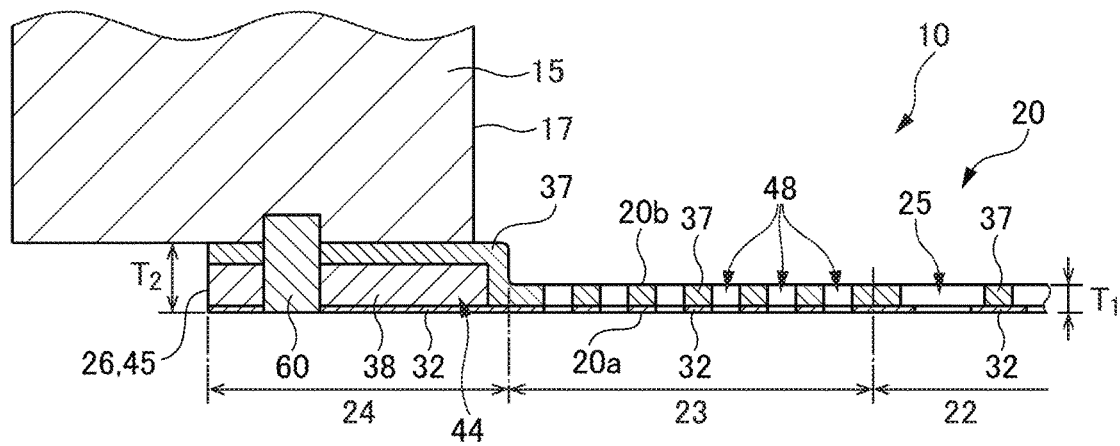
FIG. 4 is a diagram showing the vapor deposition mask device in a cross section taken along line IV-IV in FIG. 3.
Figure 5:
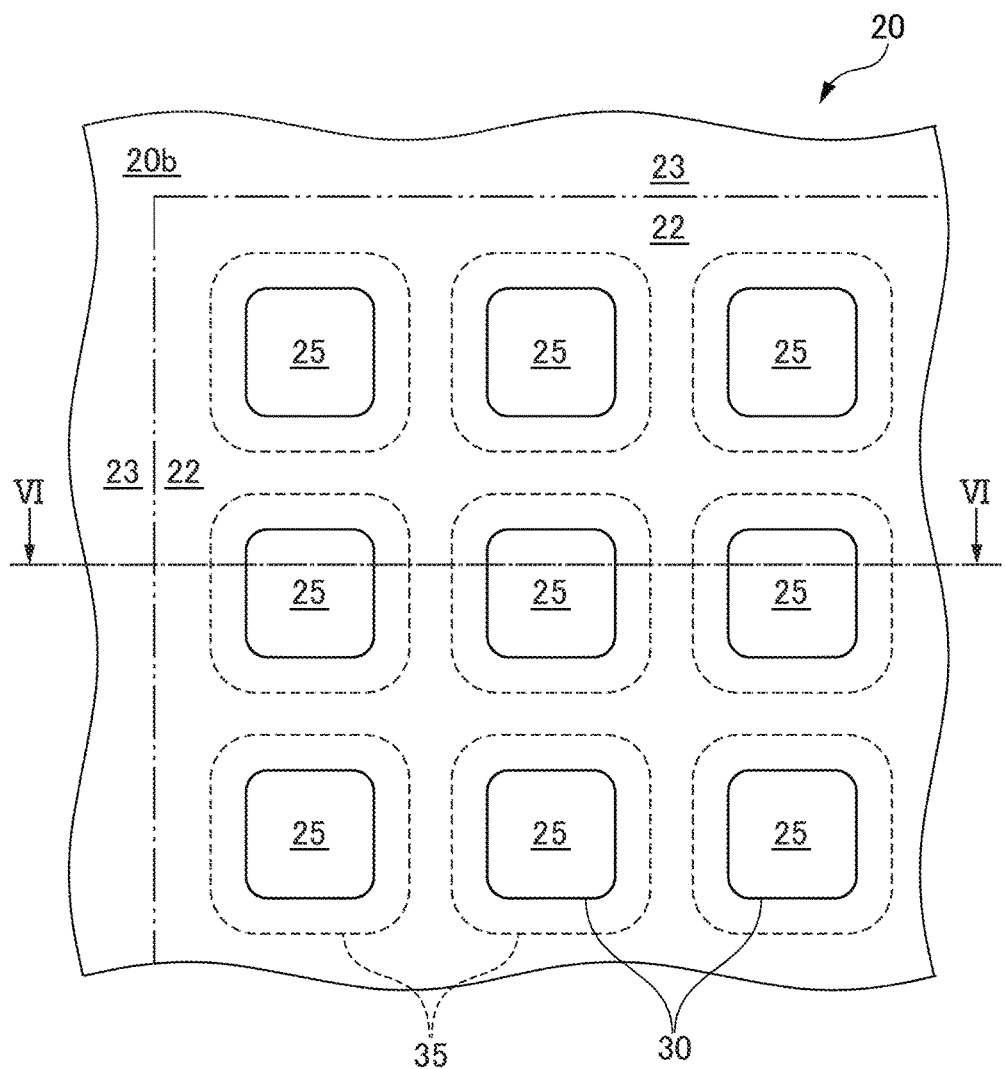
FIG. 5 is a partial plan view of the vapor deposition mask of the vapor deposition mask device of FIG. 3.
Figure 6:
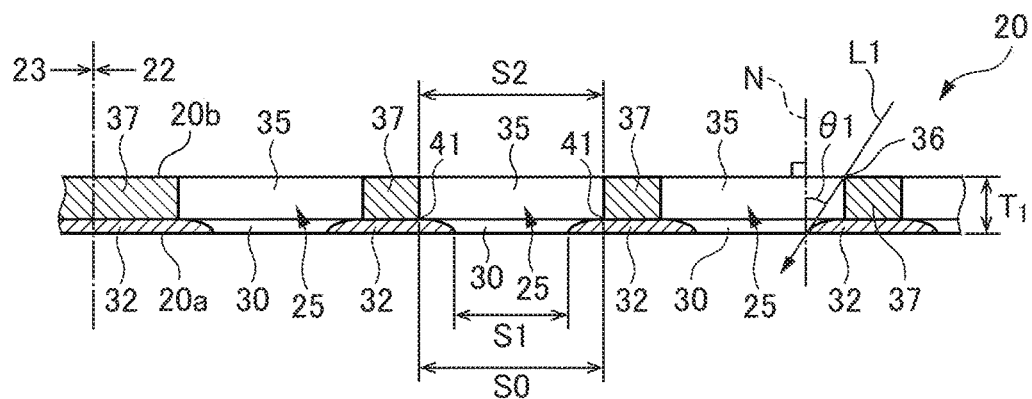
FIG. 6 is a diagram showing a vapor deposition mask in a cross section taken along line VI-VI in FIG. 5.

Next, the vapor deposition mask 20 will be described with reference to FIGS. 1 and 3 to 6. FIG. 3 is a partial plan view of the vapor deposition mask device 10 as viewed from the first face 20a side of the vapor deposition mask 20, and is an enlarged view of the portion enclosed by the dashed-dotted line marked by reference sign III in FIG. 1. FIG. 4 is a diagram showing the vapor deposition mask device 10 in a cross section taken along line IV-IV in FIG. 3. FIG. 5 is a partial plan view of a vapor deposition mask 20 of the vapor deposition mask device 10 of FIG. 3, and is an enlarged view of the portion enclosed by the dashed-dotted line marked by reference sign V in FIG. 3 is given. FIG. 6 is a diagram showing a vapor deposition mask 20 in a cross section taken along line VI-VI in FIG. 5. In addition, as shown in FIG. 6, the first metal layer 32 to be described later is, in detail, at least part of the face on a second face 20b side exposed from the second metal layer 37 is formed as a curved face. However, in FIG. 4, the cross section of the first metal layer 32 is shown as a simple rectangle in order to avoid complication of the drawing. The same applies to FIGS. 11 to 18, 20 and 25.

As shown in FIGS. 1 and 3, in the present embodiment, the vapor deposition mask 20 has a substantially quadrilateral shape in plan view, and more precisely, a substantially rectangular outline in plan view. The vapor deposition mask 20 has the effective region 22 in which the first through holes 25 are formed in a regular arrangement, a peripheral region 23 surrounding the effective region 22, and the ear region 24 located at the periphery of the vapor deposition mask 20. The vapor deposition mask 20 has a plurality of effective regions 22, and the plurality of effective regions 22 is arranged at predetermined pitches along the two directions orthogonal to each other. In the illustrated example, one effective region 22 corresponds to one organic EL display device. That is, according to the illustrated vapor deposition mask device 10, the multifaceted vapor deposition on the substrate to be vapor-deposited is possible. The ear region 24 is located to surround the peripheral region 23 and forms an outer edge 26 of the vapor deposition mask 20.

The peripheral region 23 is a region for supporting the effective region 22, and the ear region 24 is a region for attaching the vapor deposition mask 20 to the frame 15. Therefore, neither the peripheral region 23 nor the ear region 24 is a region through which the vapor deposition material 98 intended to be deposited on the organic EL substrate 92 passes. For example, in the vapor deposition mask 20 used for vapor deposition of an organic light emitting material for an organic EL display device, the effective region 22 is a region in the vapor deposition mask 20 facing a zone to be a display region of the organic EL substrate 92 where the organic light emitting material is vapor deposited to form a pixel. In the example shown in FIG. 1, each effective region 22 has a substantially quadrilateral shape in plan view, and more precisely, a substantially rectangular outline in plan view. The effective region 22 has a thickness $T_1$ (see FIG. 4), and the thickness $T_1$ is, for example, 2 μm or more and 50 μm or less. Although not shown, each effective region 22 can have outlines of various shapes according to the shape of the display region of the organic EL substrate 92. For example, each effective region 22 may have a circular outline.

The vapor deposition mask 20 and the frame 15 are fixed to each other. Therefore, the vapor deposition mask device 10 has a plurality of joint portions 60 that joins the vapor deposition mask 20 and the frame 15 to each other. The plurality of joint portions 60 is arranged along the outer edge 26 in the ear region 24 of the vapor deposition mask 20. As described above, in the present embodiment, the vapor deposition mask 20 has a substantially rectangular outline in plan view. Therefore, the plurality of joint portions 60 is also arranged in a substantially rectangular pattern along the outer edge 26 of the vapor deposition mask 20. In the example shown in FIG. 3, the plurality of joint portions 60 is arranged in a straight line with a certain distance from the outer edge 26 of the vapor deposition mask 20. That is, the plurality of joint portions 60 is arranged along a direction parallel to the direction in which the outer edge 26 of the vapor deposition mask 20 extends. In the illustrated example, the plurality of joint portions 60 is arranged at equal intervals along the direction in which the outer edge 26 extends. In the present embodiment, the vapor deposition mask 20 and the frame 15 are fixed to each other by spot welding. Therefore, each joint portion 60 is configured as a weld portion by spot welding. In addition, the disclosure is not limited thereto, and the vapor deposition mask 20 and the frame 15 may be fixed to each other by another fixing means, such as an adhesive agent, for example. That is, each joint portion 60 may be configured as, for example, an adhesive portion.

A notch 42 is formed at a position corresponding to between two adjacent joint portions 60 in the outer edge 26 of the vapor deposition mask 20. Here, the position corresponding to between two adjacent joint portions 60 at the outer edge 26 of the vapor deposition mask 20 refers to a portion of the outer edge 26 located in a direction orthogonal to the direction connecting the two adjacent joint portions 60 in the plate face of the vapor deposition mask 20 from the position between two adjacent joint portions 60. Especially in the example shown in FIG. 3, the notch 42 is formed including the position corresponding to the center between the two adjacent joint portions 60 in the outer edge 26 of the vapor deposition mask 20. That is, the notch 42 is formed including a portion of the outer edge 26 located in a direction orthogonal to the direction connecting the two adjacent joint portions 60 in the plate face of the vapor deposition mask 20 from the central position between two adjacent joint portions 60.

Since the vapor deposition mask 20 has the notch 42, an etching solution can be made to permeate through the notch 42 from the outer edge 26 side of the vapor deposition mask 20 in the separation step described later, so that a conductive pattern 52 located between the frame 15 and a base material 51 can be easily etched away.

Each notch 42 extends from the outer edge 26 of the vapor deposition mask 20 toward the effective region 22 in plan view. In the example shown in FIG. 3, the notch 42 extends from the outer edge 26 of the vapor deposition mask 20 toward the effective region 22 with a certain width. In the illustrated example, the notch 42 extends from the ear region 24 over the peripheral region 23 of the vapor deposition mask 20. In addition, the disclosure is not limited thereto, and the notch 42 may be located only in the ear region 24 of the vapor deposition mask 20. The corner of the end of the notch 42 on the effective region 22 side is rounded. Especially in the illustrated example, the end of the notch 42 on the effective region 22 side has a substantially semicircular shape. As a result, when an external force acts on the vapor deposition mask 20, stress is concentrated at a specific location in the notch 42, and it is possible to suppress the occurrence of a crack, a deformation or the like in the portion concerned.

In the example shown in FIG. 3, the vapor deposition mask 20 has a plurality of notches 42. Especially in the illustrated example, the vapor deposition mask 20 has a polygonal shape in plan view, and a plurality of notches 42 is formed along one side of the polygon. As a result, the conductive pattern 52 located between the frame 15 and the base material 51 can be etched away more efficiently.

The plurality of notches 42 has the same shape and size as one another in the illustrated example. However, the disclosure is not limited thereto, and the plurality of notches 42 may include two notches 42 having different shapes and/or sizes. For example, two notches 42 among the plurality of notches 42 may have different shapes and/or dimensions with each other in plan view of the vapor deposition mask 20. When the plurality of notches 42 includes two notches 42 having different shapes and/or dimensions with each other in plan view of the vapor deposition mask 20, the amount and/or rate of permeation of the etching solution to a space between the frame 15 and the base material 51 in the separation step can be locally changed in the two notches 42 concerned. As a result, it is possible to make uniform the progress rate of etching removal of the conductive pattern 52 located between the frame 15 and the base material 51. The disclosure is not limited thereto, and it is also possible to intentionally make a local difference in the progress rate of etching removal of the conductive pattern 52 located between the frame 15 and the base material 51.

In the example shown in FIG. 3, the notch 42 extends beyond an inner edge 17 of the frame 15 in plan view. Thus, a gap 18 is formed between the end of the notch 42 on the effective region 22 side and the inner edge 17 of the frame 15. As a result, in the separation step described later, the etching solution can be made to permeate through the gap 18 from the inner edge 17 side of the frame 15, so that the conductive pattern 52 located between the frame 15 and the base material 51 can be etched away more easily.

A joint piece 44 is formed between two adjacent notches 42. In other words, the joint piece 44 is located between the two adjacent notches 42. The vapor deposition mask 20 is joined to the frame 15 at the joint piece 44. That is, the joint piece 44 and the frame 15 are fixed to each other via the joint portion 60. In the example shown in FIG. 3, one joint portion 60 is disposed on one joint piece 44. In the illustrated example, a plurality of joint pieces 44 is arranged along the outer edge 26 of the vapor deposition mask 20. The plurality of joint pieces 44 is arranged at equal intervals along the direction in which the outer edge 26 extends.

Each joint piece 44 extends from the outer edge 26 of the vapor deposition mask 20 toward the effective region 22 in plan view. In the example shown in FIG. 3, the joint piece 44 extends from the outer edge 26 of the vapor deposition mask 20 toward the effective region 22 with a certain width except for a partial region on the effective region 22 side. In the illustrated example, the joint piece 44 extends from the ear region 24 of the vapor deposition mask 20 over the peripheral region 23. In addition, the disclosure is not limited thereto, and the joint piece 44 may be located only in the ear region 24 of the vapor deposition mask 20.

In the vapor deposition mask 20 of the present embodiment, each joint piece 44 is disposed at the outermost periphery of the vapor deposition mask 20. An end 45 located opposite the effective region 22 along the direction in which each joint piece 44 extends constitutes part of the outer edge 26 of the vapor deposition mask 20. Therefore, in the present embodiment, a substantially rectangular virtual line formed by connecting each end 45 of the plurality of joint pieces 44 forms the outer edge 26 of the vapor deposition mask 20.

At the outer edge 26 of the vapor deposition mask 20, the notch 42 has a first width $W_1$ along the direction in which the outer edge extends. The joint piece 44 has a second width $W_2$ along the direction in which the outer edge 26 extends. In the present embodiment, the first width $W_1$ of the notch 42 is larger than the second width $W_2$ of the joint piece 44. As a result, in the separation step described later, the etching solution can be made to permeate from the outer edge 26 side of the vapor deposition mask 20 through the notch 42 having the first width $W_1$ larger than the second width $W_2$ of the joint piece 44, so that the conductive pattern 52 located between the frame 15 and the base material 51 can be etched away more easily. The first width $W_1$ of the notch 42 can be, for example, 1 mm or more and 10 mm or less. The second width $W_2$ of the joint piece 44 can be, for example, 1 mm or more and 3 mm or less. The length L of the joint piece 44 (the length of the notch 42) can be, for example, 0.5 mm or more and 2.5 mm or less.

In the example shown in FIG. 4, the vapor deposition mask 20 includes the first metal layer 32, the second metal layer 37 and the ear metal layer 38. Hereinafter, the first metal layer 32, the second metal layer 37 and the ear metal layer 38 are collectively referred to simply as a metal layer. The first metal layer 32 is disposed on the first face 20a side of the vapor deposition mask 20. The second metal layer 37 is disposed closer to the second face 20b of the vapor deposition mask 20 than the first metal layer 32. The ear metal layer 38 is disposed between the first metal layer 32 and the second metal layer 37 in the ear region 24 of the vapor deposition mask 20. In the illustrated example, a face of the first metal layer 32 opposite the second metal layer 37 constitutes the first face 20a of the vapor deposition mask 20, and a face of the second metal layer 37 opposite the first metal layer 32 constitutes the second face 20b of the vapor deposition mask 20.

The illustrated ear region 24 of the vapor deposition mask 20 has a thickness larger than that of the effective region 22 since it has the ear metal layer 38. That is, the thickness $T_2$ of the ear region 24 of the vapor deposition mask 20 is larger than the thickness $T_1$ of the effective region 22. The thickness $T_2$ of the ear region 24 can be, for example, 15 μm or more and 50 μm or less. The thickness of the ear metal layer 38 can be, for example, 10 μm or more and 45 μm or less. According to the vapor deposition mask 20 having the ear region 24 having such a thickness $T_2$, the relatively thickly formed ear region 24 can support the thinned effective region 22, so that it is possible to suppress deformation in the effective region 22, and improve handling of the vapor deposition mask 20.

In the present embodiment, as described later, the vapor deposition mask 20 is manufactured using a plating method. In this case, in the metal layer (the first metal layer 32, the second metal layer 37, and the ear metal layer 38) deposited using the plating method, residual stress (internal stress) can occur. This residual stress tends to increase at a so-called solid portion in the metal layer. Here, the solid portion refers to a region in the metal layer where the opening is not formed. In addition, as the thickness of the metal layer increases, the residual stress generated in the metal layer also increases. Therefore, in the vapor deposition mask 20 of the present embodiment, the relatively large residual stress can occur in the ear region 24 having a large thickness compared to the effective region 22. When a large residual stress occurs in the ear region 24, deformation may occur in the thinned effective region 22 due to the residual stress. For example, when residual stress of contraction (tension) occurs in the ear region 24, the residual stress may cause the effective region 22 to be pulled from the periphery and deformed. The deformation of the effective region 22 causes a deterioration in the dimensional accuracy and positional accuracy of the vapor deposition material deposited through the vapor deposition mask 20.

In order to reduce such a residual stress that may occur in the ear region 24, it is effective to reduce the area of the solid portion on the inner side (the effective region 22 side) relative to each joint portion 60. To this end, it is preferable to increase the first width $W_1$ of the notch 42 and reduce the second width $W_2$ of the joint piece 44. In the present embodiment, as described above, the first width $W_1$ of the notch 42 is larger than the second width $W_2$ of the joint piece 44. As a result, the area of the solid portion in the ear region 24 having a large thickness is reduced, so that the residual stress generated in the ear region 24 can be reduced. Therefore, the deformation of the effective region 22 can be suppressed, and the dimensional accuracy and positional accuracy of the vapor deposition material vapor-deposited through the vapor deposition mask 20 can be improved.

In order to reduce the area of the solid portion on the inner side (the effective region 22 side) relative to each joint portion 60, it is preferable to provide each joint portion 60 close to the inner edge 17 of the frame 15, that is, to reduce the distance D between the joint portion 60 and the inner edge 17 of the frame 15. In the example shown in FIG. 3, the distance D is, in the plate face of the vapor deposition mask 20, the distance between the joint portion 60 and the inner edge 17 of the frame 15 measured in the direction orthogonal to the arrangement direction of the plurality of joint portions 60. By reducing the distance D, the area of the solid portion in the ear region 24 having a large thickness can be reduced, and the residual stress generated in the ear region 24 can be reduced. Therefore, the deformation of the effective region 22 can be suppressed, and the dimensional accuracy and positional accuracy of the vapor deposition material vapor-deposited through the vapor deposition mask 20 can be improved. The distance D can be, for example, 0.5 mm or more and 2.5 mm or less.

Next, with reference to FIGS. 5 and 6, the plurality of first through holes 25 formed in each effective region 22 will be described. As shown in FIG. 5, the plurality of first through holes 25 formed in the effective region 22 is arranged at predetermined pitches along two directions orthogonal to each other in the effective region 22. Here, the shape and the like of the first through holes 25 when the vapor deposition mask 20 is formed by plating treatment will be described.

As shown in FIG. 6, the vapor deposition mask 20 includes the first metal layer 32 having a first opening 30 in a predetermined pattern, and the second metal layer 37 having a second opening 35 communicating with the first opening 30 in each effective region 22.

In the present embodiment, the first through hole 25 penetrating the vapor deposition mask 20 is composed of the first opening 30 and the second opening 35 communicating with each other. In this case, the opening size and the opening shape of the first through hole 25 on the first face 20a side of the vapor deposition mask 20 are defined by the first opening 30 of the first metal layer 32. On the other hand, the opening size and the opening shape of the first through hole 25 on the second face 20b side of the vapor deposition mask 20 are defined by the second opening 35 of the second metal layer 37. In other words, the first through holes 25 has both the shape defined by the first opening 30 of the first metal layer 32 and the shape defined by the second opening 35 of the second metal layer 37.

As shown in FIG. 5, the first opening 30 and the second opening 35 constituting the first through hole 25 may have a substantially polygonal shape in plan view. Here, an example is shown in which the first opening 30 and the second opening 35 have a substantially quadrilateral shape, more specifically, a substantially square shape. Although not shown, the first opening 30 and the second opening 35 may have another substantially polygonal shape such as a substantially hexagonal shape or a substantially octagonal shape. The "substantially polygonal shape" is a concept including a shape in which the corner of a polygon is rounded. Although not shown, the first opening 30 and the second opening 35 may have a circular shape, an elliptical shape, or the like. As long as the second opening 35 has an outline surrounding the first opening 30 in plan view, the shape of the first opening 30 and the shape of the second opening 35 do not have to be similar.

In FIG. 6, reference sign 41 represents a connection portion to which the first metal layer 32 and the second metal layer 37 are connected. Further, reference sign S0 represents the dimension of the first through hole 25 in the connection portion 41 between the first metal layer 32 and the second metal layer 37. In FIG. 6, although the example in which the first metal layer 32 and the second metal layer 37 are in contact with each other is shown, the present disclosure is no limitation thereto, and another layer may be interposed between the first metal layer 32 and the second metal layer 37. For example, a catalyst layer for promoting the deposition of the second metal layer 37 on the first metal layer 32 may be provided between the first metal layer 32 and the second metal layer 37.

As shown in FIG. 6, the opening dimension S2 of the first through hole 25 (second opening 35) in the second face 20b is larger than the opening dimension S1 of the first through hole 25 (first opening 30) in the first face 20a.

In FIG. 6, a path with the smallest angle with respect to the normal direction N of the vapor deposition mask 20 of the paths of the vapor deposition material 98 that pass through an end 36 of the first through hole 25 (second opening 35) on the second face 20b side of the vapor deposition mask 20 and which can reach the organic EL substrate 92 is represented by reference sign L1. An angle between the path L1 and the normal direction N of the vapor deposition mask 20 is represented by reference sign θ1. In order to allow the obliquely moving vapor deposition material 98 to reach the organic EL substrate 92 as much as possible, it is advantageous to increase the angle θ1. For example, the angle θ1 is preferably 45° or more.

The above-described opening dimensions S0, S1, and S2 are appropriately set in consideration of the pixel density of the organic EL display device, the desired value of the above-mentioned angle θ1, and the like. For example, in the case of manufacturing an organic EL display device having a pixel density of 400 ppi or more, the opening dimension S0 of the first through hole 25 in the connection portion 41 can be set in the range of 15 μm to 60 μm. The opening dimension S1 of the first opening 30 in the first face 20a is set in the range of 10 μm to 50 μm, and the opening dimension S2 of the second opening 35 in the second face 20b can be set in the range of 15 μm to 60 μm.

In the example shown in FIG. 6 the total thickness $T_1$ of the first metal layer 32 and the second metal layer 37 in the effective region 22 can be, for example, 2 μm to 50 μm. When the thickness $T_1$ of the vapor deposition mask 20 in the effective region 22 has such a thickness, the vapor deposition mask 20 is sufficiently thinned while having desired durability, so that it is possible to suppress inhibition of the adhesion, to the organic EL substrate 92, of the vapor deposition material directed to the organic EL substrate 92 from the oblique direction, that is, the direction inclined with respect to both the direction of the plate face of the organic EL substrate 92 and the normal direction to the plate face, that is, to suppress inhibition of the occurrence of adhesion unevenness of the organic material. As a result, it is possible to effectively suppress the occurrence of uneven brightness in the organic EL display device having the organic EL substrate 92.

An iron alloy containing nickel can be used as a main material of the first metal layer 32, the second metal layer 37 and the ear metal layer 38. For example, an invar material containing 34 mass % or more and 38 mass % or less of nickel, and an iron alloy such as a super-invar material further containing cobalt in addition to nickel can be used. The disclosure is not limited thereto, and as a main material of the first metal layer 32 and the second metal layer 37, for example, iron alloys other than iron alloys containing nickel described above, such as iron alloys containing chromium, may be used. As an iron alloy containing chromium, for example, an iron alloy referred to as a so-called stainless steel can be used. Alloys such as nickel and nickel-cobalt alloys, which are other than iron alloys, may be used. The first metal layer 32 and the second metal layer 37 may be composed of materials having the same composition, or may be composed of materials having different compositions.

In the example shown in FIG. 3, the vapor deposition mask 20 has, between the plurality of joint portions 60 and the effective region 22, a plurality of third through holes 48 which does not overlap the frame 15 in plan view. Especially in the illustrated example, the plurality of third through holes 48 is provided in the peripheral region 23 of the vapor deposition mask 20. The third through hole 48 is intended to allow the etching solution to permeate through the third through holes 48 in the separation step described later. In the illustrated example, the third through hole 48 has a circular shape in plan view. The third through holes 48 are formed to have the same shape and dimensions as one another. However, the disclosure is not limited thereto, and the third through holes 48 may be formed to have different shapes or dimensions. The diameter of the third through hole 48 can be, for example, 20 μm or more and 50 μm or less.

Since the vapor deposition mask 20 has the third through hole 48, the etching solution can be made to permeate through the third through holes 48 in the separation step described later, so that the conductive pattern 52 located between the plurality of joint portions 60 and the effective region 22, particularly in the peripheral region 23, can be easily etched away.

Next, an example of a method of manufacturing the vapor deposition mask device 10 will be described.

[Patterned Substrate Preparation Process]

First, an example of a method of producing a patterned substrate 50 used to manufacture the vapor deposition mask device 10 will be described. First, the base material 51 is prepared. There is no particular limitation on the material of the base material 51 or the thickness of the base material 51 as long as the base material 51 has insulating properties and an appropriate strength. As mentioned later, in the case where the vapor deposition mask 20 and the frame 15 are welded and fixed by irradiation with a laser beam through the base material 51, a glass material having high light transparency may be suitably used as a material of the base material 51. When the vapor deposition mask 20 and the frame 15 are fixed to each other using an adhesive, glass, synthetic resin, metal or the like can be used as a material of the base material 51. In this case, the base material 51 may not have light transparency.

Figure 7:
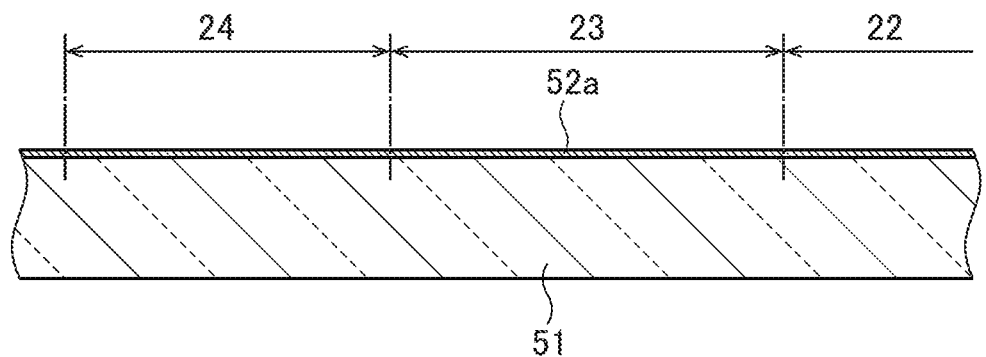
FIG. 7 is a diagram showing a process of an example of a method of producing a patterned substrate used for producing the vapor deposition mask device.

Next, as shown in FIG. 7, a conductive layer 52a made of a conductive material is formed. The conductive layer 52a is a layer to be the conductive pattern 52 by being patterned. A metal material or a material which has electroconductivity, such as an oxide conductive material, is appropriately used as a material of the conductive layer 52a. Examples of a metal material include, for example, chromium, copper, and the like. Preferably, a material having high adhesion to a first resist pattern 53 described later is used as a material of the conductive layer 52a. For example, in the case where the first resist pattern 53 is formed by patterning a so-called dry film such as a resist film containing an acrylic photocurable resin, preferably, copper is used as a material of the conductive layer 52a.

The conductive layer 52a is formed by, for example, sputtering or electroless plating. When the conductive layer 52a is to be formed thick, it takes a long time to form the conductive layer 52a. On the other hand, when the thickness of the conductive layer 52a is too thin, the resistance value is large, and it is difficult to form the first metal layer 32 by the electrolytic plating treatment. Therefore, for example, the thickness of the conductive layer 52a is preferably in the range of 50 nm to 500 nm.

Figure 8:
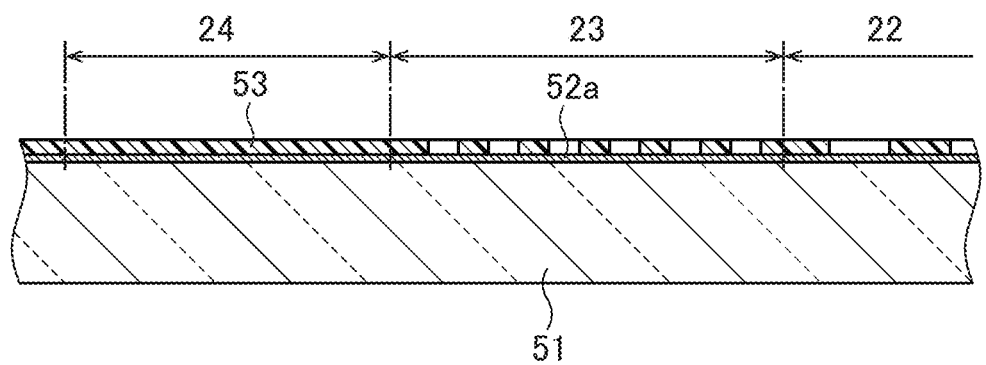
FIG. 8 is a diagram showing a process of an example of a method of producing a patterned substrate used for producing a vapor deposition mask device.
Figure 9:
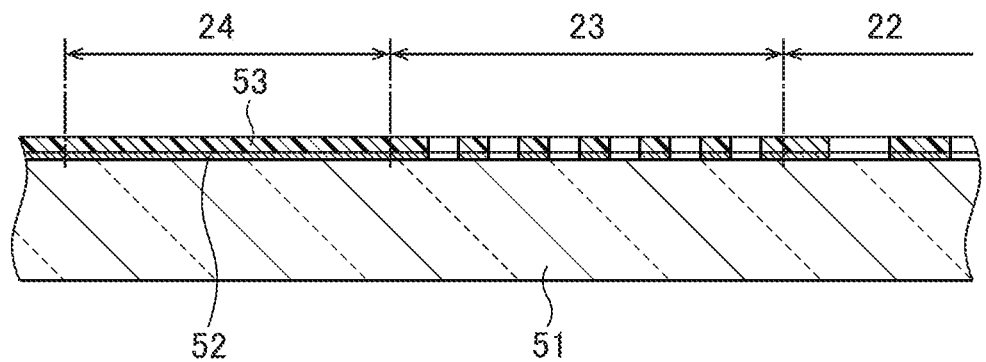
FIG. 9 is a diagram showing a process of an example of a method of producing a patterned substrate used for producing the vapor deposition mask device.
Figure 10:
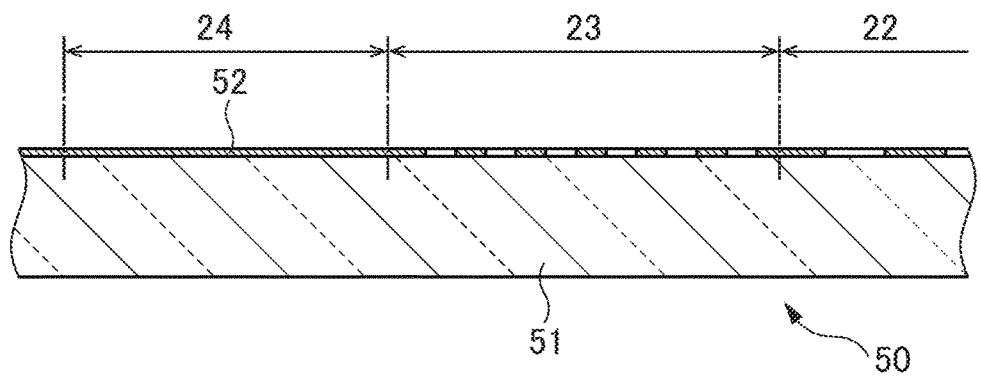
FIG. 10 is a diagram showing a process of an example of a method of producing a patterned substrate used for producing the vapor deposition mask device.

Next, as shown in FIG. 8, the first resist pattern 53 having a predetermined pattern is formed on the conductive layer 52a. As in the case of forming a second resist pattern 55 described later, a photolithography method or the like may be employed as a method of forming the first resist pattern 53. As a method of irradiating the material for the first resist pattern 53 with light in a predetermined pattern, a method in which the exposure mask that transmits exposure light in a predetermined pattern is used, and a method in which the material for the first resist pattern 53 is relatively scanned by exposure light in a predetermined pattern and the like may be employed. Thereafter, as shown in FIG. 9, the portion of the conductive layer 52a not covered by the first resist pattern 53 is removed by etching. Next, as shown in FIG. 10, the first resist pattern 53 is removed. As a result, it is possible to obtain the patterned substrate 50 on which the conductive pattern 52 having the pattern corresponding to the first metal layer 32 is formed.

[First Film Forming Process]

Figure 11:
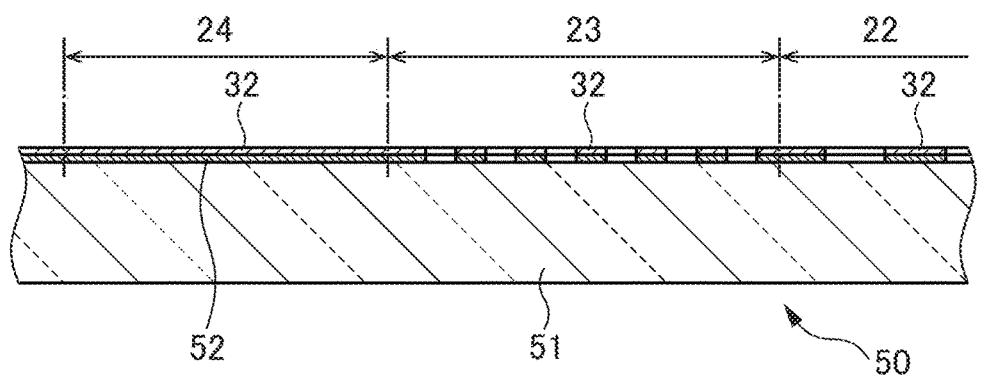
FIG. 11 is a diagram showing a process of an example of a method of manufacturing the vapor deposition mask device.

Next, the first film forming process of manufacturing the above-described first metal layer 32 using the patterned substrate 50 will be described. Here, the first metal layer 32 in which the first openings 30 are provided in a predetermined pattern is formed on the insulating base material 51. Specifically, a first plating solution is supplied on the base material 51 on which the conductive pattern 52 is formed to perform a first plating treatment process of depositing the first metal layer 32 on the conductive pattern 52. For example, the base material 51 on which the conductive pattern 52 is formed is immersed in a plating tank filled with the first plating solution. As a result, as shown in FIG. 11, it is possible to obtain the first metal layer 32, on the base material 51, in which the first openings 30 are provided in a predetermined pattern. The thickness of the first metal layer 32 is, for example, 5 µm or less. Note that forming the first metal layer 32 on the base material 51 is not limited to forming the first metal layer 32 directly on the base material 51, but also includes forming the first metal layer 32 via another layer such as the conductive pattern 52 on the base material 51.

As long as the first metal layer 32 can be deposited on the conductive pattern 52, the specific method of the first plating treatment process is not particularly limited. For example, the first plating treatment process may be performed as a so-called electrolytic plating treatment process in which the first metal layer 32 is deposited on the conductive pattern 52 by supplying a current to the conductive pattern 52. Alternatively, the first plating treatment process may be an electroless plating treatment process. When the first plating treatment process is an electroless plating treatment process, an appropriate catalyst layer may be provided on the conductive pattern 52. Alternatively, the conductive pattern 52 may be configured to function as a catalyst layer. The catalyst layer may be provided on the conductive pattern 52 when the electrolytic plating treatment process is performed.

The components of the first plating solution to be used are appropriately determined according to the characteristics required for the first metal layer 32. For example, a mixed solution of a solution containing a nickel compound and a solution containing an iron compound can be used as the first plating solution. For example, a mixed solution of a solution containing nickel sulfamate or nickel bromide and a solution containing ferrous sulfamate can be used. The plating solution may contain various additives. As an additive, pH buffers such as boric acid, a primary brightener such as sodium saccharin, butynediol, propargyl alcohol, coumarin, formalin, a secondary brightener such as thiourea, an antioxidant, etc. may be used.

[Second Resist Pattern Forming Process]

Figure 12:
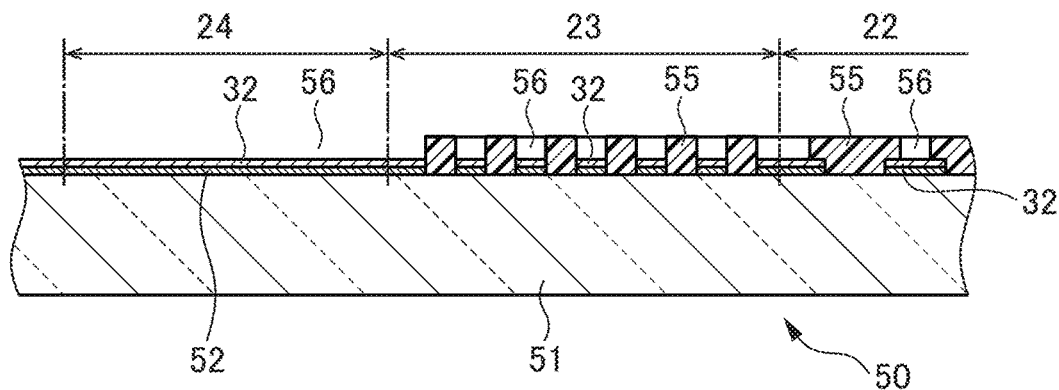
FIG. 12 is a diagram showing a process of an example of a method of manufacturing the vapor deposition mask device.

Next, the second resist pattern forming process of forming the second resist pattern 55 on the base material 51 and the first metal layer 32 with a predetermined gap 56 is performed. FIG. 12 is a cross-sectional view of a second resist pattern 55 formed on the base material 51. As shown in FIG. 12 the resist formation process is performed such that the first opening 30 of the first metal layer 32 is covered by the second resist pattern 55, and the gap 56 of the second resist pattern 55 is located on the first metal layer 32. At this time, the second resist pattern 55 is not formed in the region corresponding to the ear region 24. Here, the gap 56 indicates a portion where the second resist pattern 55 is not formed. Therefore, it can be said that the gap 56 is formed also in the region corresponding to the ear region 24 of the vapor deposition mask 20.

Hereinafter, an example of the resist formation process will be described. First, a negative resist film is formed by attaching a dry film on the base material 51 and the first metal layer 32. An example of a dry film includes, for example, a film which contains acrylic photocurable resin, such as RY3310 made by Hitachi Chemical Co., Ltd. A material for the second resist pattern 55 may be applied to the base material 51, and then, if necessary, firing may be performed to form a resist film. Next, an exposure mask that prevents light from passing through the region to be the gap 56 of the resist film is prepared to place an exposure mask on the resist film. Thereafter, the exposure mask sufficiently comes into close contact with the resist film by vacuum contact. A positive type may be used as the resist film. In this case, as the exposure mask, an exposure mask which allows light to pass through a region to be removed of the resist film is used.

Thereafter, the resist film is exposed through the exposure mask. Further, the resist film is developed to form an image on the exposed resist film. In order to make the second resist pattern 55 contact more firmly the base material 51 and the first metal layer 32, a heat treatment process of heating the second resist pattern 55 may be performed after the development process.

[Ear Metal Layer Forming Process]

Next, the ear metal layer forming process of forming the ear metal layer 38 in the region corresponding to the ear region 24 is performed.

Figure 13:
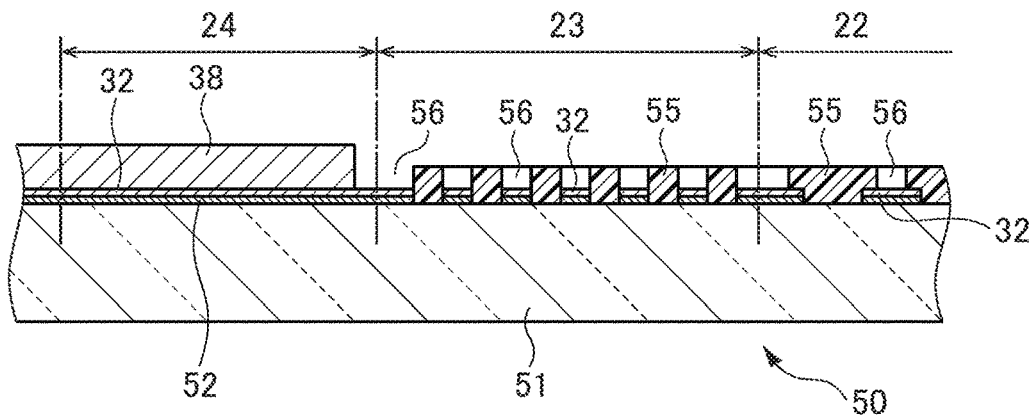
FIG. 13 is a diagram showing a process of an example of a method of manufacturing the vapor deposition mask device.

In the ear metal layer forming process, in the state where the region where the ear metal layer 38 is not intended to be formed (in the example shown in FIG. 12, the effective region 22, the peripheral region 23, and the end of the ear region 24 on the effective region 22 side) is covered with a shielding member, a plating solution for forming the ear metal layer is supplied on the first metal layer 32 exposed from the shielding member to deposit the ear metal layer 38 on the first metal layer 32. For example, in the state where the region where the ear metal layer 38 is not intended to be formed is covered by the shielding member, the laminate of the base material 51, the conductive pattern 52, the first metal layer 32, and the second resist pattern 55 is immersed in a plating tank filled with a plating solution for forming the ear metal layer. As a result, as shown in FIG. 13, the ear metal layer 38 can be formed on the first metal layer 32 in the ear region 24. The thickness of the ear metal layer 38 can be, for example, 10 μm or more and 45 μm or less.

As long as the ear metal layer 38 can be deposited on the first metal layer 32, the specific method of the ear metal layer forming process is not particularly limited. For example, the ear metal layer forming process may be performed as a so-called electrolytic plating treatment process in which the ear metal layer 38 is deposited on the first metal layer 32 by supplying a current to the first metal layer 32. Alternatively, the ear metal layer forming process may be an electroless plating treatment process. When the ear metal layer forming process is an electroless plating treatment process, an appropriate catalyst layer may be provided on the first metal layer 32. The catalyst layer may be provided on the first metal layer 32 when the electrolytic plating treatment process is performed.

The same plating solution as the above-described first plating solution may be used as the plating solution for forming the ear metal layer. Alternatively, a plating solution different from the first plating solution may be used as the plating solution for forming the ear metal layer. When the composition of the first plating solution and the composition of the plating solution for forming the ear metal layer are the same, the composition of the metal of which the first metal layer 32 is made and the composition of the metal of which the ear metal layer 38 is made is also the same.

[Second Film Forming Process]

Figure 14:
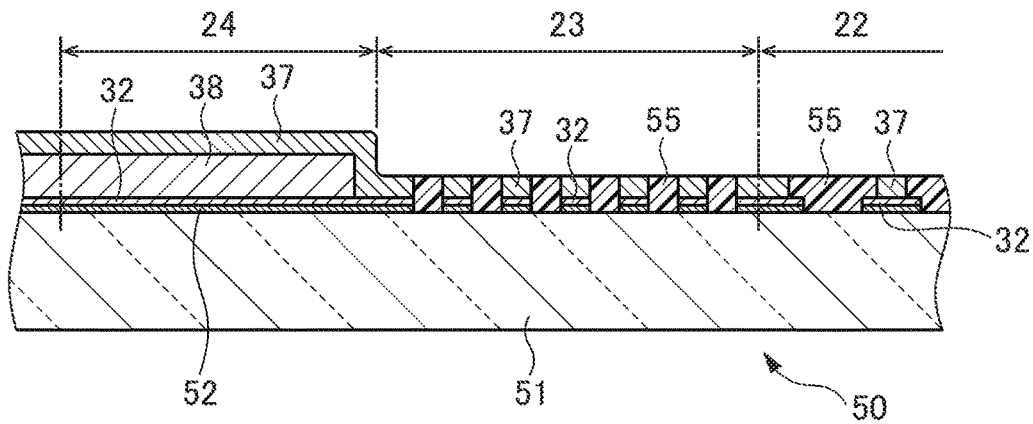
FIG. 14 is a diagram showing a process of an example of a method of manufacturing the vapor deposition mask device.

Next, the second film forming process of forming the second metal layer 37 on the first metal layer 32 and the ear metal layer 38 is performed. In the second film forming process, the second metal layer 37 having the second opening 35 communicating with the first opening 30 is formed on the first metal layer 32. Especially in the present embodiment, in the second film forming process, the second metal layer 37 is formed over the first metal layer 32 and the ear metal layer 38. Specifically, a second plating solution is supplied into the gap 56 of the second resist pattern 55 and on the ear metal layer 38 to perform a second plating treatment process of depositing the second metal layer 37 on the first metal layer 32 and the ear metal layer 38. For example, the base material 51 on which the first metal layer 32 and the ear metal layer 38 are formed is immersed in a plating tank filled with the second plating solution. As a result, as shown in FIG. 14, the second metal layer 37 can be formed on the first metal layer 32 and the ear metal layer 38. The thickness of the second metal layer 37 is set such that the thickness $T_1$ of the metal layer of the vapor deposition mask 20 in the effective region 22 is 2 μm or more and 50 μm or less.

In the example shown in FIG. 14 the thickness of the first metal layer 32 in the effective region 22 and the thickness of the first metal layer 32 in the ear region 24 are the same. The thickness of the second metal layer 37 in the effective region 22 and the thickness of the second metal layer 37 in the ear region 24 are also the same. Thus, the thickness $T_2$ of the ear region 24 is greater than the thickness $T_1$ of the effective region 22 due to the presence of the ear metal layer 38.

As long as the second metal layer 37 can be deposited on the first metal layer 32 and the ear metal layer 38, the specific method of the second plating treatment process is not particularly limited. For example, the second plating treatment process may be performed as a so-called electrolytic plating treatment process in which the second metal layer 37 is deposited on the first metal layer 32 and the ear metal layer 38 by applying a current to the first metal layer 32 and the ear metal layer 38. Alternatively, the second plating treatment process may be an electroless plating treatment process. When the second plating treatment process is an electroless plating treatment process, an appropriate catalyst layer may be provided on the first metal layer 32 and the ear metal layer 38. When the electrolytic plating treatment process is performed, a catalyst layer may be provided on the first metal layer 32 and the ear metal layer 38.

The same plating solution as the first plating solution described above or the plating solution for forming the ear metal layer may be used as the second plating solution. Alternatively, a plating solution different from the first plating solution or the plating solution for forming the ear metal layer may be used as the second plating solution. When the composition of the first plating solution and the composition of the second plating solution are the same, the composition of the metal of which the first metal layer 32 is made and the composition of the metal of which the second metal layer 37 is made are also the same. When the composition of the plating solution for forming the ear metal layer and the composition of the second plating solution are the same, the composition of the metal of which the ear metal layer 38 is made and the composition of the metal of which the second metal layer 37 is made are also the same.

In FIG. 14, the example shows that the second plating treatment process is continued until the upper face of the second resist pattern 55 and the upper face of the second metal layer 37 are aligned. The present disclosure is not limited thereto. The second plating treatment process may be stopped with the upper face of the second metal layer 37 located below the upper face of the second resist pattern 55.

[Removal Process]

Figure 15:
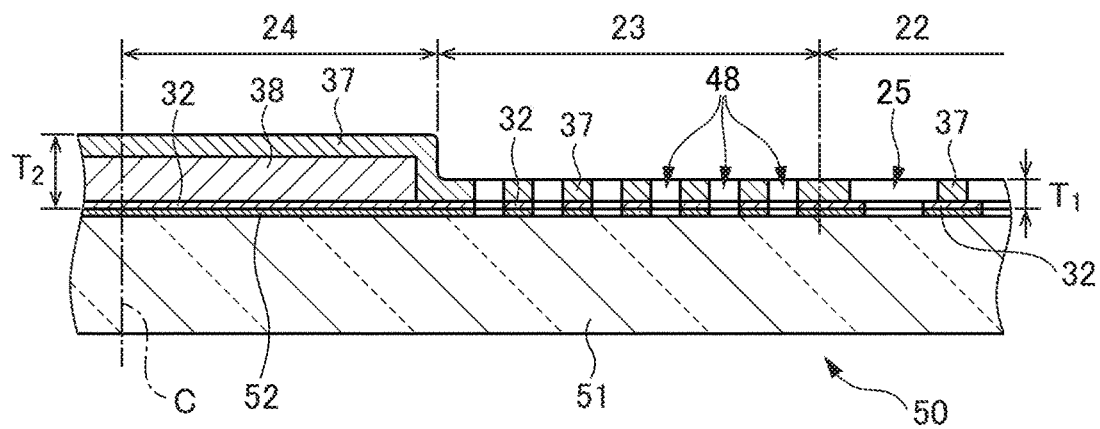
FIG. 15 is a diagram showing a process of an example of a method of manufacturing the vapor deposition mask device.

Thereafter, a removal process of removing the second resist pattern 55 is performed. The removal process is performed by immersing a laminate of the patterned substrate 50, the first metal layer 32, the ear metal layer 38, the second metal layer 37, and the second resist pattern 55 in, for example, an alkaline stripping solution. As a result, as shown in FIG. 15, the second resist pattern 55 can be separated from the patterned substrate 50, the first metal layer 32 and the second metal layer 37.

[Cutting Process]

Figure 16:
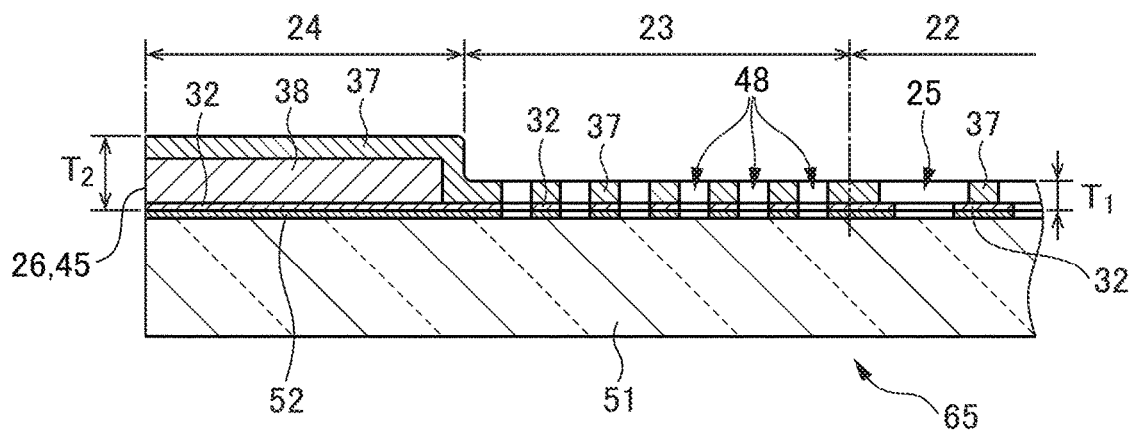
FIG. 16 is a diagram showing a process of an example of a method of manufacturing the vapor deposition mask device.

Next, a cutting process of cutting the patterned substrate 50, the first metal layer 32, the ear metal layer 38, and the second metal layer 37 along a cutting line at a position to be the outer edge 26 of the vapor deposition mask 20 is performed. In FIG. 15, this cutting line is indicated by the dashed-dotted line marked by reference sign C. A laminate 65 of the base material 51, the conductive pattern 52, the first metal layer 32, the ear metal layer 38, and the second metal layer 37 which is cut out is shown in FIG. 16.

[Joining Step]

Next, a joining step of joining the metal layers (the first metal layer 32, the second metal layer 37, and the ear metal layer 38) to the frame 15 is performed. In the joining step, the metal layers of the laminate 65 including the base material 51, the conductive pattern 52 provided on the base material 51, and the metal layer provided on opposite side, with respect to the base material 51, of the conductive pattern 52 are joined to the frame 15 at a plurality of joint portions 60. Especially in the present embodiment, the joint piece 44 in the laminate 65 is joined to the frame 15 (see FIG. 19). In the example shown in FIG. 17, the metal layer and the frame 15 are fixed to each other by spot welding. Especially in the illustrated example, the metal layer and the frame 15 are fixed to each other by laser spot welding. In addition, the disclosure is not limited thereto, and in a joining step, the metal layer and the frame 15 may be fixed to each other by, for example, another fixing means such as an adhesive.

Figure 17:
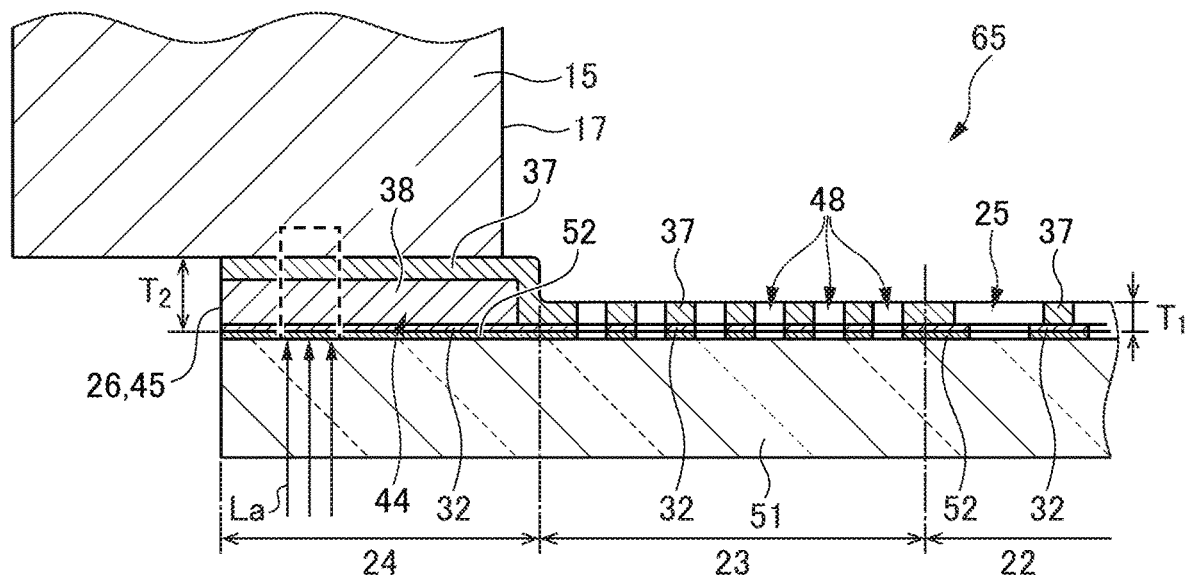
FIG. 17 is a diagram showing a process of an example of a method of manufacturing the vapor deposition mask device.

In the example shown in FIG. 17, the laminate 65 and the frame 15 are disposed such that the second metal layer 37 of the joint piece 44 and the frame 15 are in contact with each other. Next, the joint piece 44 of the laminate 65 is irradiated with the laser light La through the base material 51 from the base material 51 side to melt part of the joint piece 44 and part of the frame 15 by the heat generated by the irradiation with the laser light La, and the joint piece 44 and the frame 15 are fixed by welding.

As the laser light La, for example, YAG laser light generated by a YAG laser device can be used. As a YAG laser device, it is possible to use a device provided with, for example, a crystal obtained by adding Nd (neodymium) to YAG (yttrium aluminum garnet) as a medium for oscillation.

Figure 18:
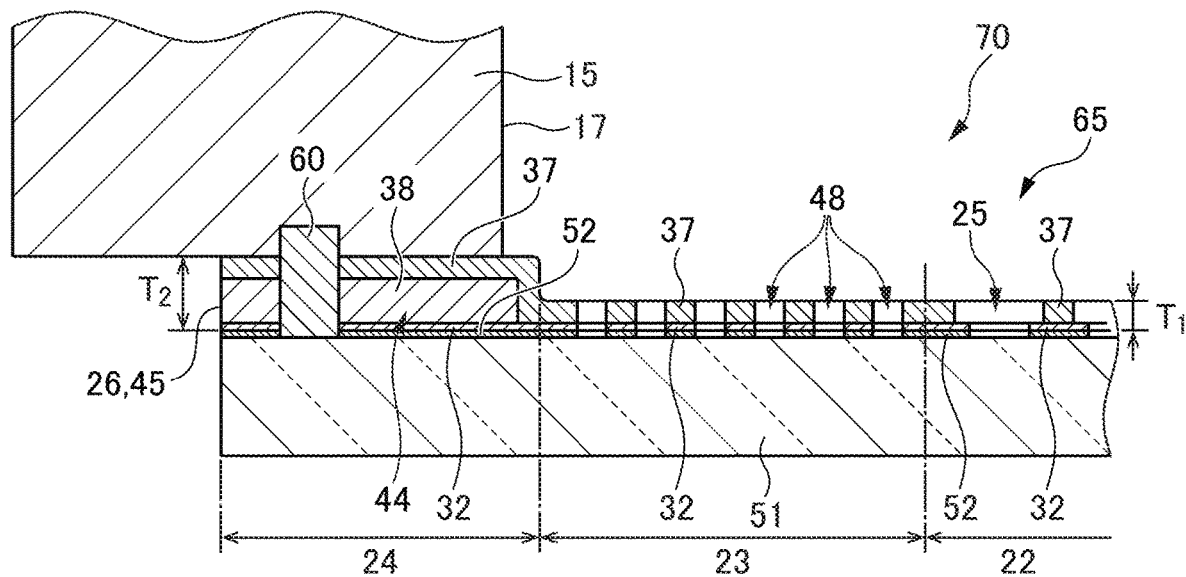
FIG. 18 is a diagram showing a process of an example of a method of manufacturing the vapor deposition mask device.
Figure 19:
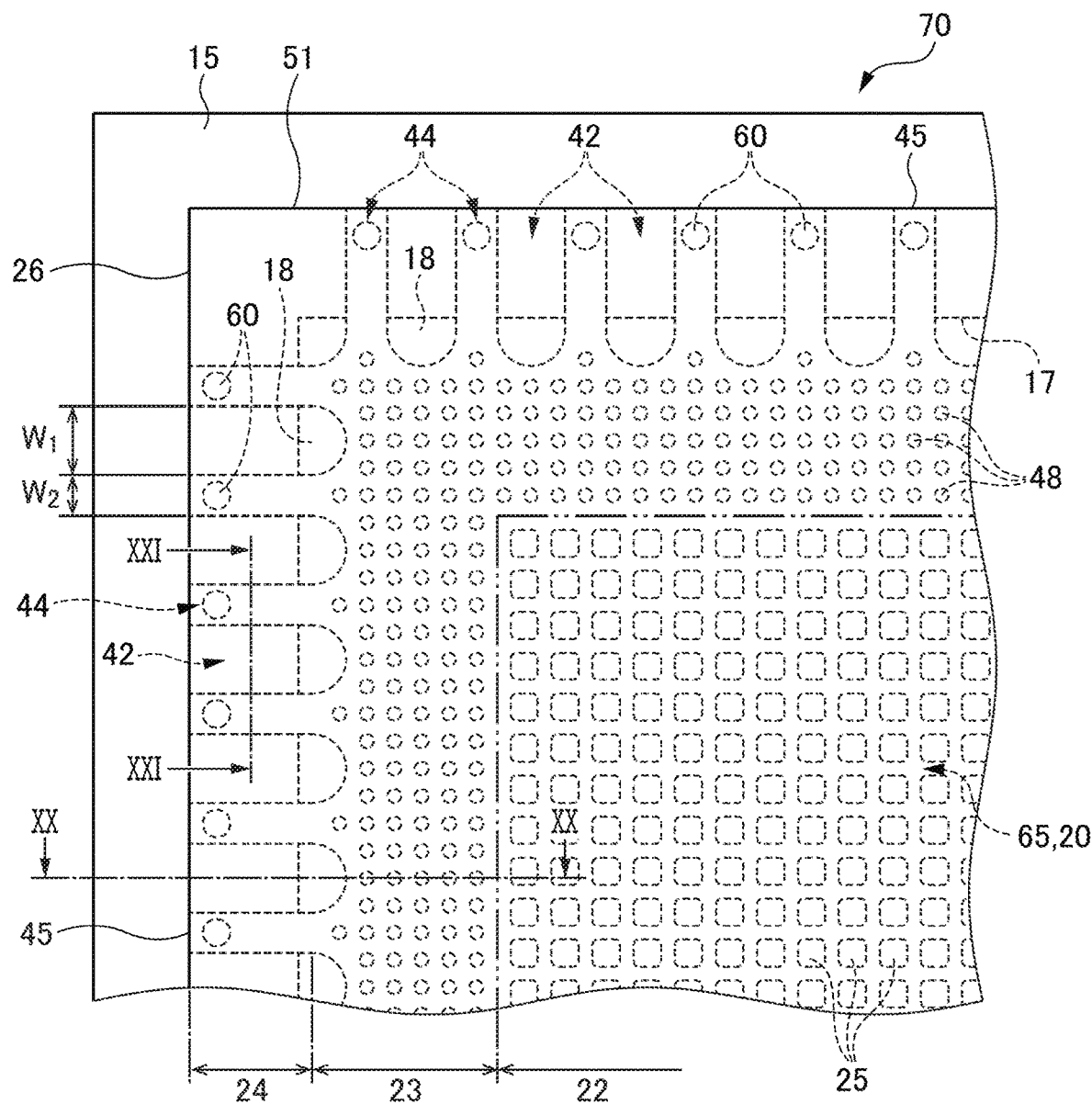
FIG. 19 is a partial plan view of an intermediate member for manufacturing the vapor deposition mask device.

As a result, as shown in FIG. 18, the joint portion 60 that joins the joint piece 44 and the frame 15 is formed, and an intermediate member 70 having the base material 51, the first metal layer 32, the ear metal layer 38, the second metal layer 37, and the frame 15 is obtained. FIG. 19 is a partial plan view of the intermediate member 70. In FIG. 19, the intermediate member 70 is shown as viewed from the base material 51 side. In the illustrated example, the intermediate member 70 has a plurality of joint portions 60 that joins the metal layers 32, 37, and 38 of the laminate 65 (vapor deposition mask 20) and the frame 15 to each other, the plurality of joint portions 60 is arranged along the outer edge 26 of the laminate 65, and the notch 42 is formed at a position corresponding to between two adjacent joint portions 60 in the outer edge 26 of the laminate 65.

[Separation Step]

Next, a separation step of separating the combination of the first metal layer 32, the ear metal layer 38, the second metal layer 37 and the frame 15 from the base material 51 is performed. In the separation step, first, the intermediate member 70 is immersed in an etching solution capable of selectively etching the conductive pattern 52. Next, the combination of the first metal layer 32, the ear metal layer 38, the second metal layer 37, and the frame 15 is peeled off and separated from the base material 51. After that, the combination of the first metal layer 32, the ear metal layer 38, the second metal layer 37, and the frame 15 is immersed again in the etching solution to completely etch away the conductive pattern 52 attached to and remaining on the first metal layer 32. As a result, as shown in FIG. 4, the vapor deposition mask device 10 can be obtained in which the vapor deposition mask 20 including the first metal layer 32 having the first openings 30 in a predetermined pattern, the second metal layer 37 having the second opening 35 communicating with the first opening 30, and the ear metal layer 38 disposed between the first metal layer 32 and the second metal layer 37 in the ear region 24, and the frame 15 are joined by a plurality of joint portions 60.

Figure 20:
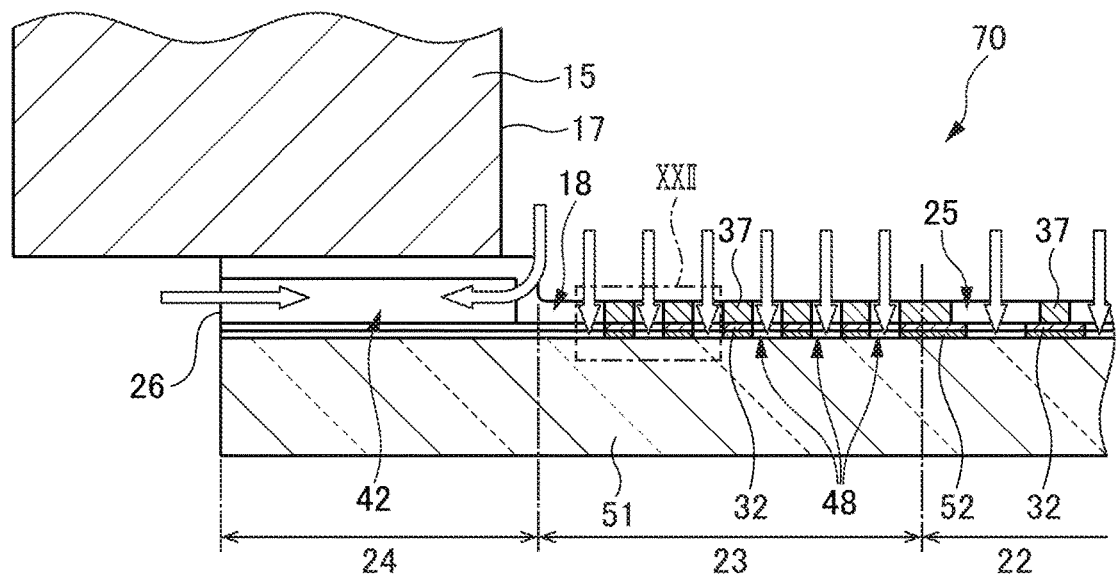
FIG. 20 is a diagram showing the intermediate member in a cross section taken along line XX-XX in FIG. 19.
Figure 21:
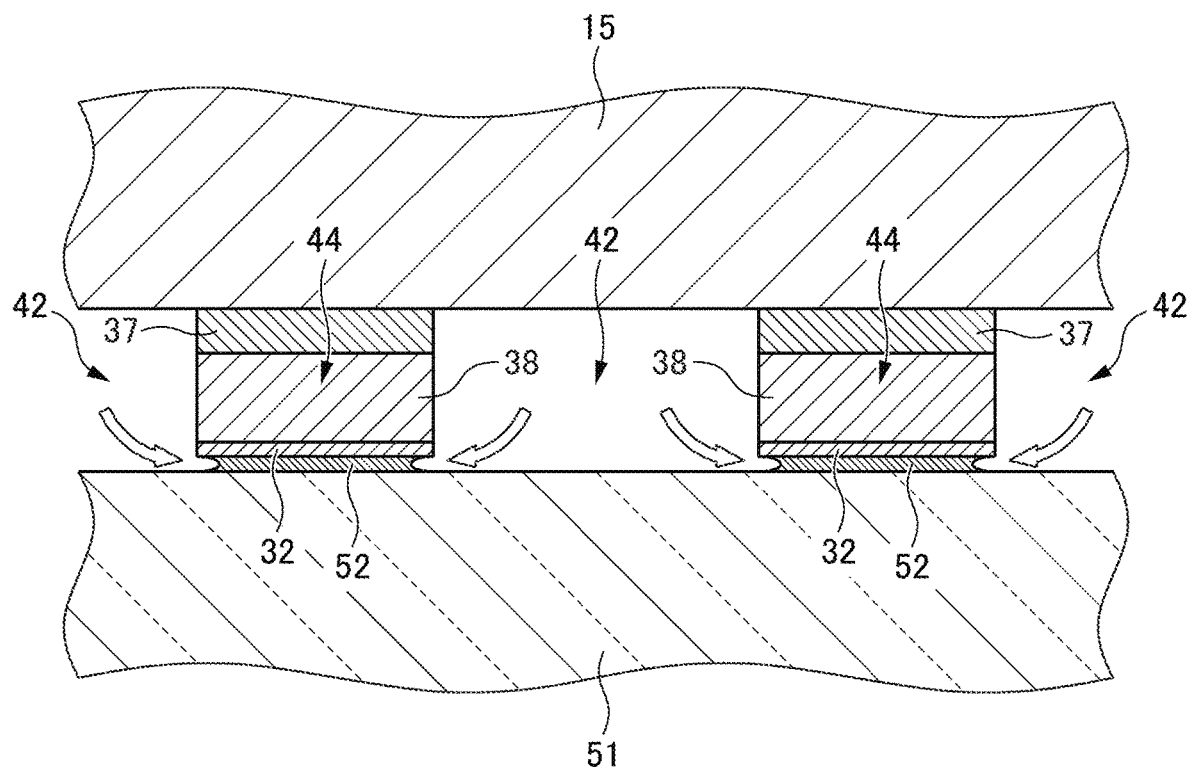
FIG. 21 is a diagram showing the intermediate member in a cross section taken along line XXI-XXI in FIG. 19.
Figure 22:
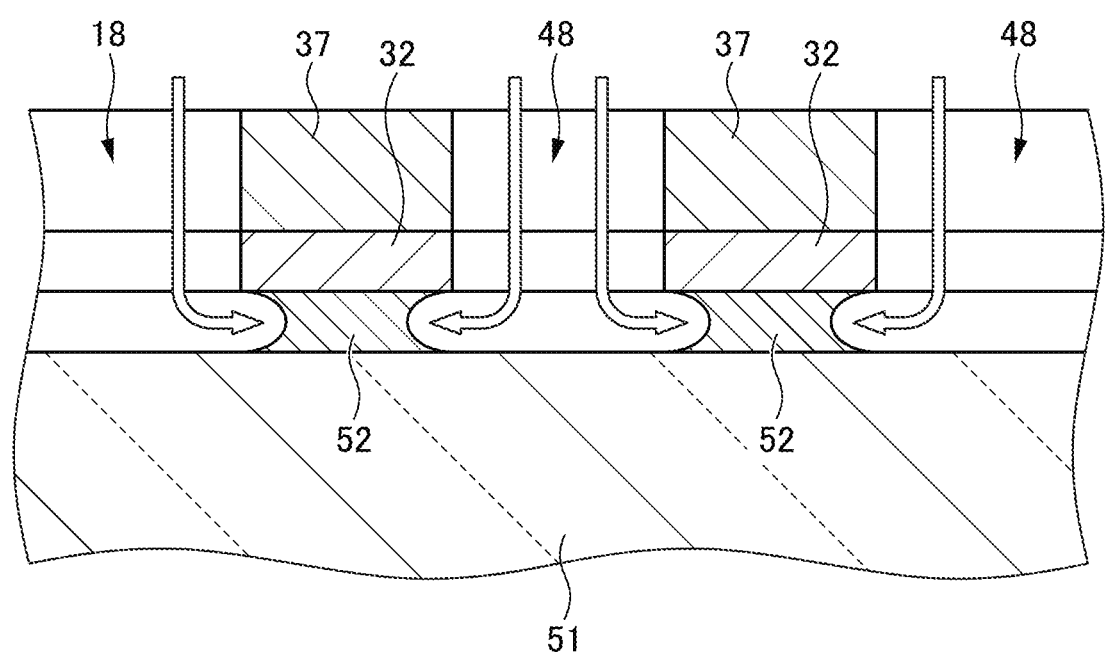
FIG. 22 is an enlarged view of part of the cross section of FIG. 20.

The etching removal of the conductive pattern 52 in this separation step will be further described with reference to FIGS. 20 to 22. FIG. 20 is a view showing the intermediate member 70 in a cross section taken along line XX-XX in FIG. 19. FIG. 21 is a diagram showing the intermediate member 70 in a cross section taken along line XXI-XXI in FIG. 19. FIG. 22 is an enlarged view of part of the cross section of FIG. 20, and in particular, shows the intermediate member 70 in the region enclosed by the dashed-dotted line marked by reference sign XXII in FIG. 20.

In the separation step, in the example shown in FIG. 20, the etching solution permeates into the notch 42 from the outer edge 26 side of the laminate 65 (vapor deposition mask 20). In the illustrated example, the etching solution also permeates into the notch 42 from the inner edge 17 side of the frame 15 via the gap 18.

As shown in FIG. 21, the conductive pattern 52 present between the joint piece 44 and the base material 51 is exposed in the notch 42. Therefore, by means of the etching solution that has permeated into the notch 42, the conductive pattern 52 is etched from the exposed face in the notch 42 or side face. Here, as an etching solution, by using an etching solution that does not dissolve the first metal layer 32, the ear metal layer 38, the second metal layer 37, or the frame 15, but that dissolves only the conductive pattern 52, the first metal layer 32, the ear metal layer 38, the second metal layer 37, and the frame 15 are not eroded by the etching solution, and only the conductive pattern 52 can be dissolved and removed. In the illustrated example, the etching progresses inward from both side faces of the conductive pattern 52. As the etching progresses, a face formed by the etching progressing from one side and a face formed by the etching progressing from the other side are connected. As a result, the first metal layer 32 of the joint piece 44 and the base material 51 are separated.

In the example shown in FIG. 20, the vapor deposition mask 20 has a plurality of third through holes 48 provided between the plurality of joint portions 60 and the effective region 22 and not overlapping the frame 15 in plan view. Thus, in the separation step, the etching solution permeates into the third through holes 48.

As shown in FIG. 22, the conductive pattern 52 present between the first metal layer 32 and the base material 51 in the peripheral region 23 is exposed in the third through hole 48. Therefore, by means of the etching solution that has permeated into the third through hole 48, the conductive pattern 52 is etched from the exposed face in the third through hole 48 or side face. In the illustrated example, the etching progresses inward from both side faces of the conductive pattern 52. As the etching progresses, a face formed by the etching advanced from one side and a face formed by the etching progressed from the other side are connected. As a result, the first metal layer 32 in the peripheral region 23 and the base material 51 are separated.

In the example shown in FIG. 20, the conductive pattern 52 present between the first metal layer 32 and the base material 51 in the effective region 22 is exposed in the first through hole 25. Therefore, by means of the etching solution that has permeated into the first through holes 25, the conductive pattern 52 is etched from the exposed face or side face in the first through hole 25. In the illustrated example, the etching progresses inward from both side faces of the conductive pattern 52. As the etching progresses, a face formed by the etching advanced from one side and a face formed by the etching progressed from the other side are connected. As a result, the first metal layer 32 in the effective region 22 and the base material 51 are separated.

Thus, the conductive pattern 52 is etched away from the intermediate member 70, and the first metal layer 32 and the base material 51 are separated. That is, the combination of the first metal layer 32, the ear metal layer 38, the second metal layer 37 and the frame 15 is separated from the base material 51. In the etching removal process of the conductive pattern 52, the first metal layer 32 and the base material 51 may not be completely separated. That is, the first metal layer 32 and the base material 51 may be partially connected by the conductive pattern 52. In this case, by peeling off the base material 51 from the combination of the first metal layer 32, the ear metal layer 38, the second metal layer 37, and the frame 15, the conductive pattern 52 partially connecting the first metal layer 32 and the base material 51 is broken, and the base material 51 can be separated from the combination. In addition, the conductive pattern 52 attached to and remaining on the first metal layer 32 can be completely etched away by immersing the combination of the first metal layer 32, the ear metal layer 38, the second metal layer 37, and the frame 15 in the etching solution again.

A vapor deposition mask device 10 according to the present embodiment includes the vapor deposition mask 20 having the effective region 22 in which a plurality of first through holes 25 is disposed, and the frame 15 attached to the vapor deposition mask 20, wherein the vapor deposition mask device 10 includes a plurality of joint portions 60 that joins the vapor deposition mask 20 and the frame 15 to each other, the plurality of joint portions 60 is arranged along the outer edge 26 of the vapor deposition mask 20, and the notch 42 is formed at a position corresponding to between two adjacent joint portions 60 in the outer edge 26 of the vapor deposition mask 20.

According to the vapor deposition mask device 10, in the separation step of separating the base material 51 from the combination of the metal layers 32, 37, and 38 and the frame 15, which constitute the laminate 65 (the vapor deposition mask 20), when manufacturing the vapor deposition mask device 10, the etching solution can be made to permeate through the notch 42 from the outer edge 26 side of the laminate 65 (vapor deposition mask 20), so that the conductive pattern 52 located between the frame 15 and the base material 51, that is, between the joint piece 44 and the base material 51, can be easily etched away. As a result, without applying tension to the vapor deposition mask 20, the vapor deposition mask 20 can be joined to the frame 15, so that wrinkles and deformation of the vapor deposition mask 20 of the vapor deposition mask device 10 can be effectively suppressed.

In the vapor deposition mask device 10 of the present embodiment, the vapor deposition mask 20 includes the joint piece 44 located between two adjacent notches 42, wherein at the outer edge 26, the notch 42 has the first width $W_1$ along the direction in which the outer edge 26 extends, the joint piece 44 has the second width $W_2$ along the direction in which the outer edge 26 extends, and the first width $W_1$ is larger than the second width $W_2$.

According to the vapor deposition mask device 10, in the separation step the etching solution can be made to permeate through the notch 42 having a first width $W_1$ larger than the second width $W_2$ of the joint piece 44 from the outer edge 26 side of the laminate 65 (the vapor deposition mask 20), so that the conductive pattern 52 located between the frame 15 and the base material 51, that is, between the joint piece 44 and the base material 51, can be etched away more easily. Therefore, separation of the base material 51 from the combination of the metal layers 32, 37, and 38 and the frame 15 can be performed in a short time, and the manufacture of the vapor deposition mask device 10 can be effectively speeded up. Furthermore, the area of the solid portion in the ear region 24 having a large thickness as compared with the effective region 22 is reduced, and the metal layers 32, 37, and 38 are formed by using a plating method, so that it is possible to reduce the residual stress (internal stress) generated in the ear region 24. Therefore, the deformation of the effective region 22 can be suppressed, and the dimensional accuracy and positional accuracy of the vapor deposition material vapor-deposited through the vapor deposition mask 20 can be improved.

In the vapor deposition mask device 10 of the present embodiment, the notch 42 extends beyond the inner edge 17 of the frame 15 in plan view of the vapor deposition mask 20.

According to the vapor deposition mask device 10, the gap 18 can be formed between the end of the notch 42 on the effective region 22 side and the inner edge 17 of the frame 15. As a result, in the separation step, the etching solution can be made to permeate through the gap 18 from the inner edge 17 side of the frame 15, so that the conductive pattern 52 located between the frame 15 and the base material 51 can be etched away more easily.

In the vapor deposition mask device 10 of the present embodiment, the vapor deposition mask 20 has a polygonal shape in plan view, and a plurality of notches 42 is formed along one side of the polygon.

According to the vapor deposition mask device 10, a plurality of notches 42 is formed on one side of the polygon that constitutes the plan view shape of the vapor deposition mask 20, so that the conductive pattern 52 located between the frame 15 and the base material 51 can be etched away more efficiently.

In the vapor deposition mask device 10 of the present embodiment includes a plurality of notches 42, wherein the plurality of notches 42 includes two notches 42 having shapes and/or dimensions different from each other in plan view of the vapor deposition mask 20.

The vapor deposition mask device 10 includes two notches 42 having different shapes and/or dimensions with each other, so that the amount and/or rate of permeation of the etching solution to a space between the frame 15 and the base material 51 in the separation step can be locally changed in the two notches 42 concerned. As a result, it is possible to make uniform the progress rate of etching removal of the conductive pattern 52 located between the frame 15 and the base material 51. The disclosure is not limited thereto, and it is also possible to intentionally make a local difference in the progress rate of etching removal of the conductive pattern 52 located between the frame 15 and the base material 51.

In the vapor deposition mask device 10 of the present embodiment, the vapor deposition mask 20 has, between the plurality of joint portions 60 and the effective region 22, a plurality of third through holes 48 which does not overlap the frame 15 in plan view.

According to the vapor deposition mask device 10, the etching solution can be made to permeate through the third through holes 48 in the separation step, so that the conductive pattern 52 located between the plurality of joint portions 60 and the effective region 22, particularly in the peripheral region 23, can be easily etched away. Therefore, separation of the base material 51 from the combination of the metal layers 32, 37, and 38 and the frame 15 can be performed in a shorter time, and the manufacture of the vapor deposition mask device 10 can be effectively speeded up.

The method of manufacturing the vapor deposition mask device 10 according to the present embodiment is a method of manufacturing the vapor deposition mask device 10 which includes the vapor deposition mask 20 having the effective region 22 in which the plurality of first through holes 25 is arranged, and the frame 15 attached to the vapor deposition mask 20. The method includes a joining step of joining, to the frame 15, the metal layers 32, 37, and 38 of the laminate 65 including the base material 51, the conductive pattern 52 provided on the base material 51, and the metal layers 32, 37, and 38 provided on opposite side, with respect to the base material 51, of the conductive pattern 52 by the plurality of joint portions 60, and a separation step of etching away the conductive pattern 52 to separate the base material 51 from the metal layers 32, 37, and 38, and forming the vapor deposition mask 20 from the metal layers 32, 37, and 38.

According to the method of manufacturing the vapor deposition mask device 10, the metal layers 32, 37, and 38 of the laminate 65 forming the vapor deposition mask 20 can be joined to the frame 15 while being held on the base material 51, so that even while joining the vapor deposition mask 20 to the frame 15 without applying tension to the vapor deposition mask 20, the flatness of the vapor deposition mask 20 can be secured. As a result, it is possible to effectively suppress the occurrence of wrinkles and deformation in the vapor deposition mask 20 of the vapor deposition mask device 10 resulting from the application of tension to the vapor deposition mask 20.

In the method of manufacturing the vapor deposition mask device 10 of the present embodiment, a plurality of joint portions 60 is arranged along the outer edge 26 of the metal layers 32, 37, and 38, and the notch 42 is formed, in the outer edge 26 of the metal layers 32, 37, and 38, at a position corresponding to between two adjacent joint portions 60 in the arrangement direction of the plurality of joint portions 60.

According to the method of manufacturing the vapor deposition mask device 10, in the separation step, the etching solution can be made to permeate through the notch 42 from the outer edge 26 side of the laminate 65 (the vapor deposition mask 20), so that the conductive pattern 52 located between the frame 15 and the base material 51, that is, between the joint piece 44 and the base material 51, can be etched away easily.

It is to be noted that various modifications can be made to the above-described embodiment. Hereinafter, modifications will be described with reference to the drawings as needed. In the following description and the drawings used in the following description, the same reference signs as those used for the corresponding parts in the above-described embodiments are used for parts that can be configured as in the above-described embodiments, and duplicate explanation will be omitted. In the case where it is clear that the effects and advantages obtained in the above-described embodiment can be obtained also in the modification, the description may be omitted.

Figure 23:
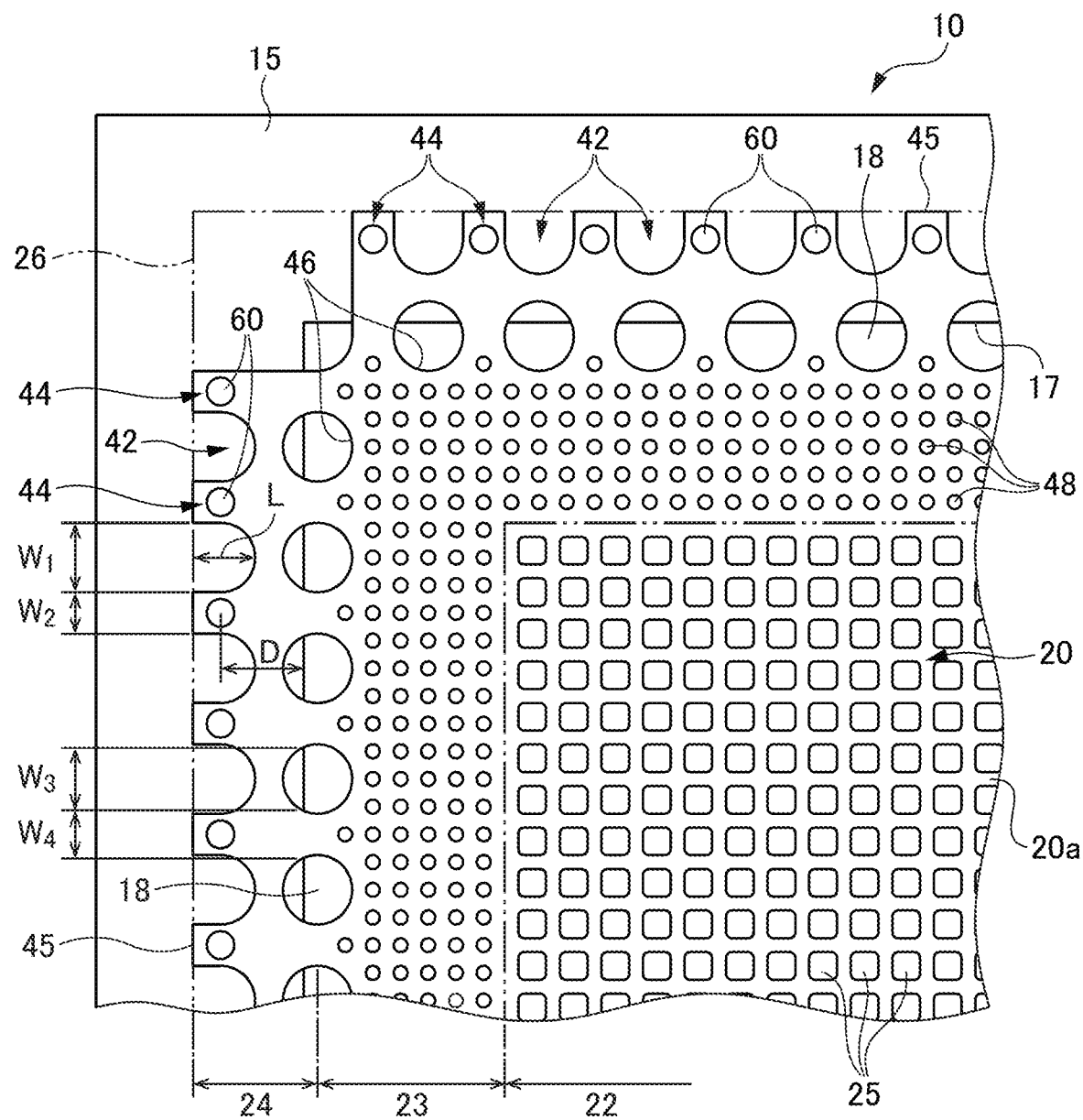
FIG. 23 is a partial plan view of a modification of the vapor deposition mask device.

FIG. 23 is a partial plan view of a modification of the vapor deposition mask device 10. In the illustrated example, the vapor deposition mask 20 of the vapor deposition mask device 10 has, between the plurality of joint portions 60 and the effective region 22, a plurality of second through holes 46 overlapping the inner edge 17 of the frame 15 in plan view. Each second through hole 46 is disposed at a position corresponding to between two adjacent joint portions 60. Here, the fact that the second through hole 46 overlaps the inner edge 17 of the frame 15 in plan view, and is disposed at a position corresponding to between two adjacent joint portions 60 indicates that the second through hole 46 overlaps the portion of the inner edge 17 of the frame 15 located in the direction orthogonal to the direction connecting the two adjacent joint portions 60 in the plate face of the vapor deposition mask 20 from a position between the two adjacent joint portions 60. Especially in the illustrated example, the second through hole 46 is formed including a position corresponding to the center between two adjacent joint portions 60 in the inner edge 17 of the frame 15. That is, the second through hole 46 is formed including a portion of the inner edge 17 of the frame 15 located in a direction orthogonal to the direction connecting the two adjacent joint portions 60 in the plate face of the vapor deposition mask 20 from the central position between two adjacent joint portions 60.

In the example shown in FIG. 23, each second through hole 46 is formed in a circular shape in plan view. As a result, when an external force acts on the vapor deposition mask 20, stress is concentrated at a specific location in the second through hole 46, and it is possible to suppress the occurrence of a crack, deformation or the like in the portion concerned. The disclosure is not limited thereto, and each second through hole 46 may have another shape such as an elliptical shape or a polygonal shape such as a rectangular shape in plan view. When each second through hole 46 is formed in a shape having a corner such as a polygonal shape in plan view, preferably, the corners are rounded from the viewpoint of alleviating stress concentration in the second through hole 46 when an external force acts on the vapor deposition mask 20. In the illustrated example, the diameter of the second through hole 46 can be, for example, 1 mm or more and 10 mm or less.

By forming the second through hole 46, as shown in FIG. 23, the vapor deposition mask 20 has the gap 18 between the peripheral edge of the second through hole 46 on the effective region 22 side and the inner edge 17 of the frame 15.

Since the vapor deposition mask 20 has the second through hole 46, the etching solution can be made to permeate through the gap 18 formed by the second through holes 46 and the inner edge 17 of the frame 15 from the inner edge 17 side of the frame 15 in the separation step, so that the conductive pattern 52 located between the frame 15 and the base material 51 can be easily etched away.

In a region overlapping the inner edge 17 of the frame 15 in plan view, the second through hole 46 has a third width $W_3$ along the direction in which the inner edge 17 extends. The metal layer of the vapor deposition mask 20 located between the two adjacent second through holes 46 in the direction in which the inner edge 17 extends has a fourth width $W_4$ along the direction in which the inner edge 17 extends. In this modification, the third width $W_3$ is larger than the fourth width $W_4$. As a result, the etching solution can be made to permeate from the inner edge 17 side of the frame 15 through the second through hole 46 (the gap 18) having the third width $W_3$ larger than the fourth width $W_4$ in the separation step, so that the conductive pattern 52 located between the frame 15 and the base material 51 can be etched away more easily.

Further, the third width $W_3$ is larger than the fourth width $W_4$, the area of the solid portion in the ear region 24 having a large thickness as compared with the effective region 22 is reduced, and the metal layers 32, 37, and 38 are formed by using a plating method, so that it is possible to reduce the residual stress (internal stress) generated in the ear region 24. Therefore, the deformation of the effective region 22 can be suppressed, and the dimensional accuracy and positional accuracy of the vapor deposition material vapor-deposited through the vapor deposition mask 20 can be improved.

The third width $W_3$ can be, for example, 1 mm or more and 10 mm or less. The fourth width $W_4$ can be, for example, 1 mm or more and 3 mm or less.

In FIG. 23, although the example in which both the notch 42 and the second through hole 46 are provided was shown, the disclosure is not limited thereto, and the vapor deposition mask 20 may have only the second through hole 46 without the notch 42.

Figure 24:
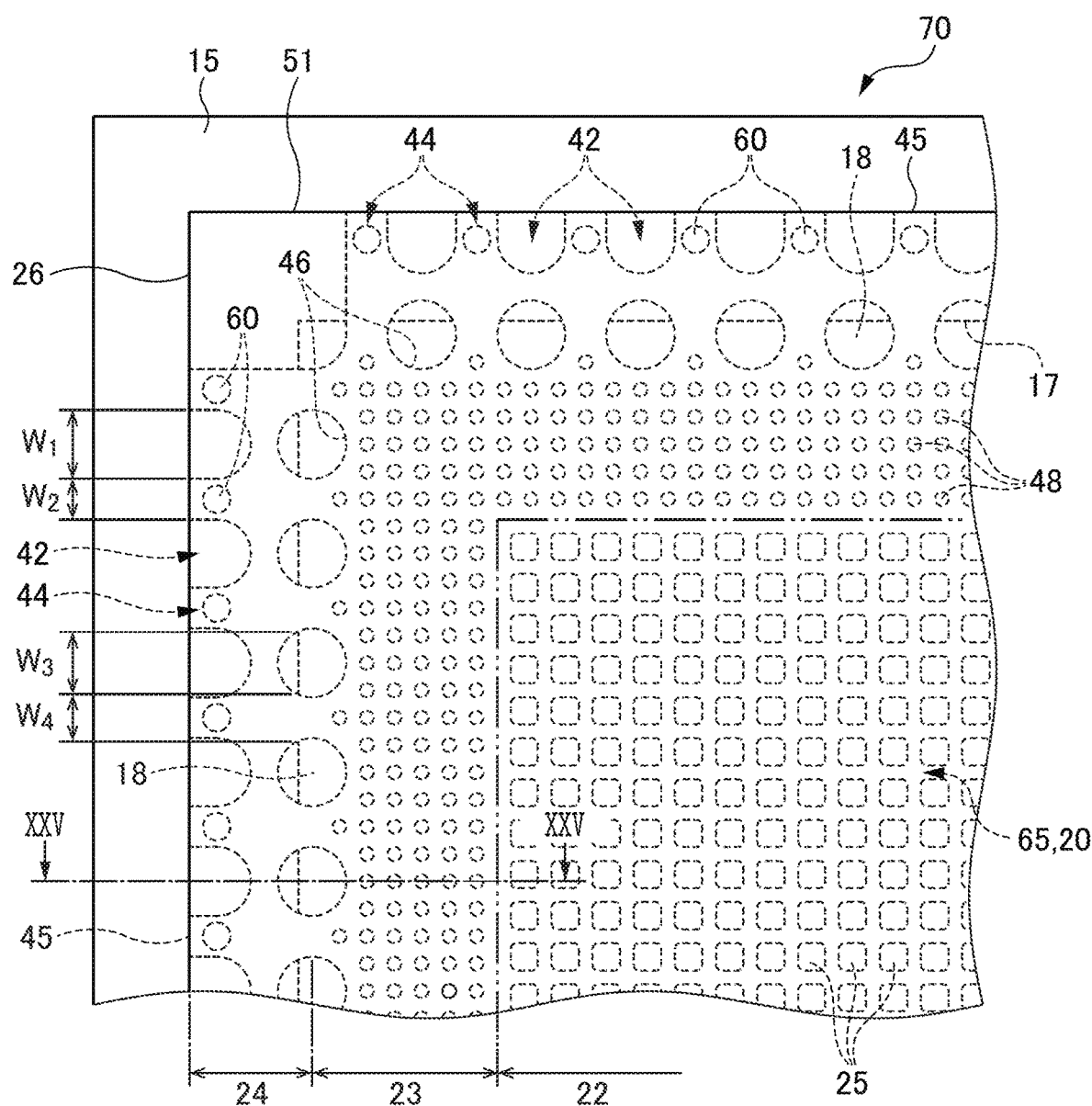
FIG. 24 is a partial plan view of a modification of the intermediate member.

Next, an example of the method of manufacturing the vapor deposition mask device 10 in this modification is described. As in the above-described embodiment, by performing the process from the patterned substrate preparation process to the joining step, the intermediate member 70 including the base material 51, the first metal layer 32, the ear metal layer 38, the second metal layer 37, and the frame 15 is obtained as shown in FIG. 24. In FIG. 24, the intermediate member 70 is shown as viewed from the base material 51 side. In the illustrated example, the intermediate member 70 has a plurality of joint portions 60 that joins the metal layers 32, 37, and 38 of the laminate 65 (vapor deposition mask 20) and the frame 15 to each other, the plurality of joint portions 60 is arranged along the outer edge 26 of the laminate 65, the laminate 65 has, between the plurality of joint portions 60 and the effective region 22, a plurality of second through holes 46 overlapping the inner edge 17 of the frame 15 in plan view, and each second through hole 46 is disposed at a position corresponding to between two adjacent joint portions 60.

Figure 25:
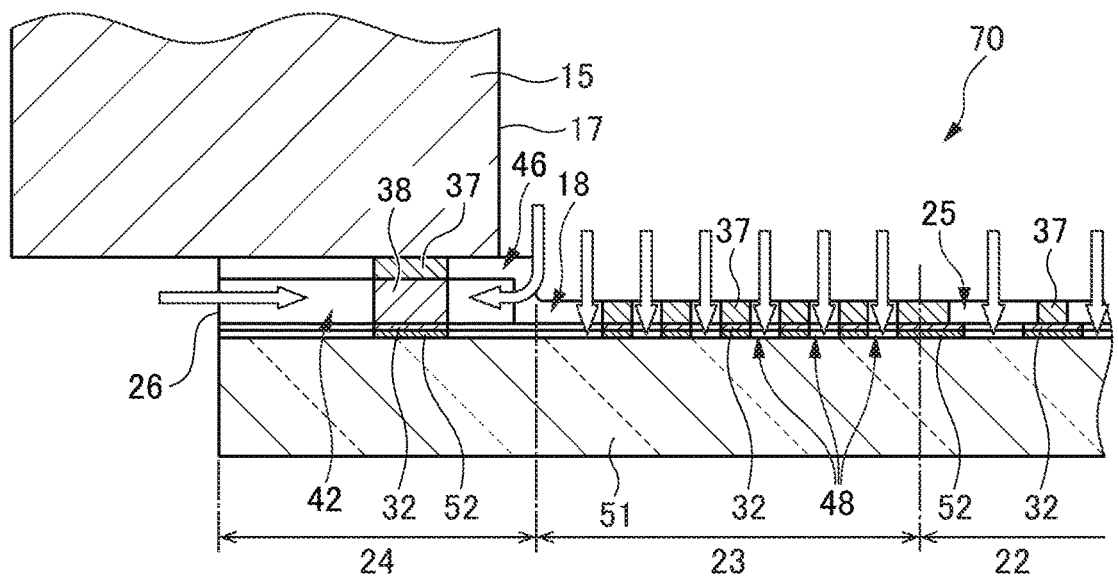
FIG. 25 is a diagram showing the intermediate member in a cross section taken along line XXV-XXV in FIG. 24.

The etching removal of the conductive pattern 52 in the separation step will be described in detail with reference to FIG. 25. FIG. 25 is a view of the intermediate member 70 in a cross section taken along line XXV-XXV in FIG. 24.

In the separation step, in the example shown in FIG. 25, the etching solution permeates into the second through hole 46 through the gap 18 from the inner edge 17 side of the frame 15. Here, the conductive pattern 52 located between the frame 15 and the base material 51 has a side face exposed in the second through hole 46. Therefore, the conductive pattern 52 is etched from the side face exposed to the second through hole 46 by means of the etching solution that has permeated into the second through hole 46. In the illustrated example, etching progresses inward from the side face of the conductive pattern 52 exposed to the second through hole 46.

In the illustrated example, the etching solution permeates into the notch 42 also from the outer edge 26 side of the laminate 65 (vapor deposition mask 20). Here, in the illustrated example, the conductive pattern 52 located between the frame 15 and the base material 51 also has a side face exposed in the notch 42. Therefore, the conductive pattern 52 is also etched from the side face exposed in the notch 42 by means of the etching solution that has permeated into the notch 42.

In the illustrated example, the etching progresses inward from both side faces of the conductive pattern 52. As the etching progresses, a face formed by etching progressing from one side and a face formed by the etching progressing from the other side are connected. As a result, the first metal layer 32 located between the frame 15 and the base material 51 and the base material 51 are separated. The conductive pattern 52 present between the first metal layer 32 and the base material 51 in the peripheral region 23, and the conductive pattern 52 present between the first metal layer 32 and the base material 51 in the effective region 22 are etched away in the same manner as the above embodiment.

Thus, the conductive pattern 52 is etched away from the intermediate member 70, and the first metal layer 32 and the base material 51 are separated. That is, the combination of the first metal layer 32, the ear metal layer 38, the second metal layer 37 and the frame 15 is separated from the base material 51.

The vapor deposition mask device 10 according to the present modification includes the vapor deposition mask 20 having the effective region 22 in which a plurality of first through holes 25 is disposed, and the frame 15 attached to the vapor deposition mask 20, wherein the vapor deposition mask device 10 includes a plurality of joint portions 60 that joins the vapor deposition mask 20 and the frame 15 to each other, the plurality of joint portions 60 is arranged along the outer edge 26 of the vapor deposition mask 20, and the vapor deposition mask 20 has, between the plurality of joint portions 60 and the effective region 22, a plurality of second through holes 46 overlapping the inner edge 17 of the frame 15 in plan view, and each second through hole 46 is disposed at a position corresponding to between two adjacent joint portions 60.

According to the vapor deposition mask device 10, in the separation step of separating the base material 51 from the combination of the metal layers 32, 37, and 38 and the frame 15, which constitute the laminate 65 (the vapor deposition mask 20), when manufacturing the vapor deposition mask device 10, the etching solution can be made to permeate through the second through holes 46 from the inner edge 17 side of the frame 15, so that the conductive pattern 52 located between the frame 15 and the base material 51 can be easily etched away. As a result, without applying tension to the vapor deposition mask 20, the vapor deposition mask 20 can be joined to the frame 15, so that wrinkles and deformation of the vapor deposition mask 20 of the vapor deposition mask device 10 can be effectively suppressed.

In the vapor deposition mask device 10 according to the present modification, in the region overlapping the inner edge 17 of the frame 15 in plan view, the second through hole 46 has the third width $W_3$ along the direction in which the inner edge 17 extends, the metal layer of the vapor deposition mask 20 located between the two adjacent second through holes 46 in the direction in which the inner edge 17 extends has the fourth width $W_4$ along the direction in which the inner edge 17 extends, and the third width $W_3$ is larger than the fourth width $W_4$.

According to the vapor deposition mask device 10, the etching solution can be made to permeate through the second through hole 46 having the third width $W_3$ larger than the fourth width $W_4$ from the inner edge 17 side of the frame 15 in the separation step, so that the conductive pattern 52 located between the frame 15 and the base material 51 can be etched away more easily. Therefore, separation of the base material 51 from the combination of the metal layers 32, 37, and 38 and the frame 15 can be performed in a short time, and the manufacture of the vapor deposition mask device 10 can be effectively speeded up. Furthermore, the area of the solid portion in the ear region 24 having a large thickness as compared with the effective region 22 is reduced, and the metal layers 32, 37, and 38 are formed by using a plating method, so that it is possible to reduce the residual stress (internal stress) generated in the ear region 24. Therefore, the deformation of the effective region 22 can be suppressed, and the dimensional accuracy and positional accuracy of the vapor deposition material vapor-deposited through the vapor deposition mask 20 can be improved.

In the method of manufacturing the vapor deposition mask device 10 according to the present modification, the plurality of joint portions 60 is arranged along the outer edge 26 of the metal layers 32, 37, and 38, the metal layers 32, 37, and 38 have, between the plurality of joint portions 60 and the effective region 22, a plurality of second through holes 46 overlapping the inner edge 17 of the frame 15 in plan view, and each second through hole 46 is disposed at a position corresponding to between two adjacent joint portions 60 in the arrangement direction of the plurality of joint portions 60.

According to the method of manufacturing the vapor deposition mask device 10, the etching solution can be made to permeate through the second through holes 46 from the inner edge 17 side of the frame 15 in the separation step, so that the conductive pattern 52 located between the frame 15 and the base material 51 can be easily etched away.

Figure 26:
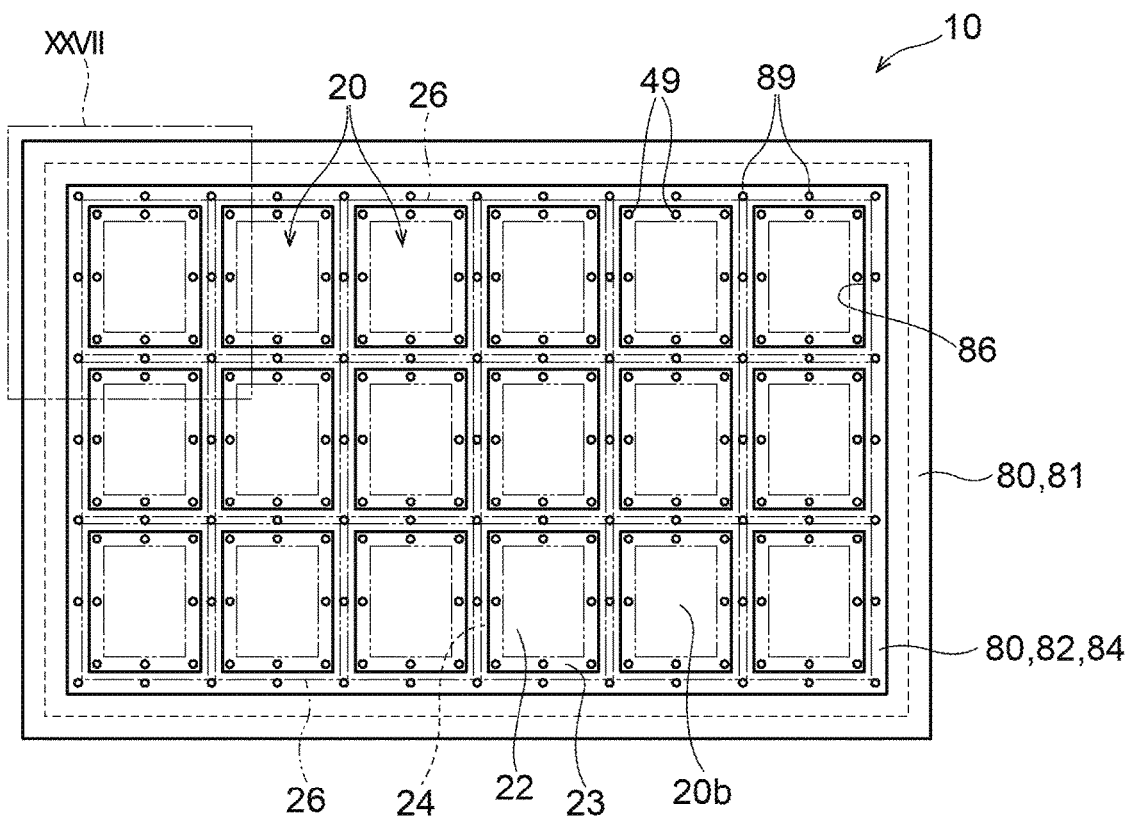
FIG. 26 is a plan view of another modification of the vapor deposition mask device.
Figure 28:
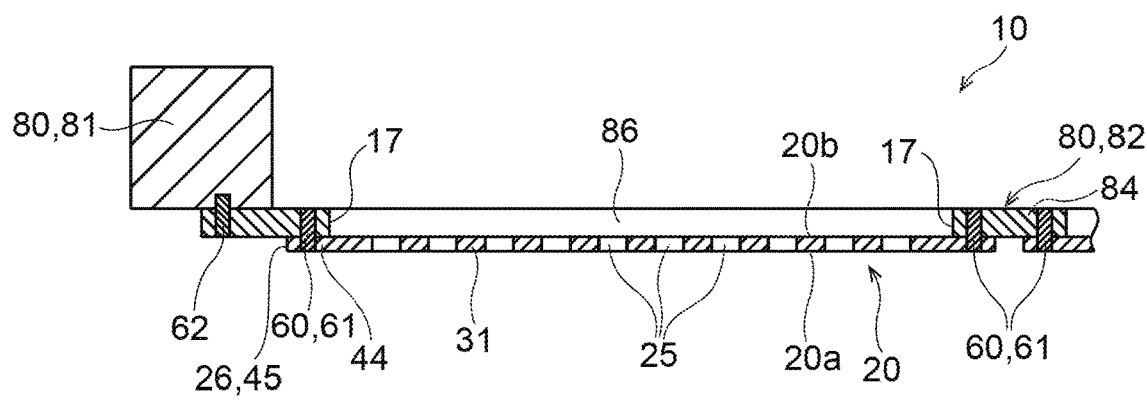
FIG. 28 is a diagram showing the vapor deposition mask device in a cross section taken along line XXVIII-XXVIII in FIG. 27.
Figure 29:
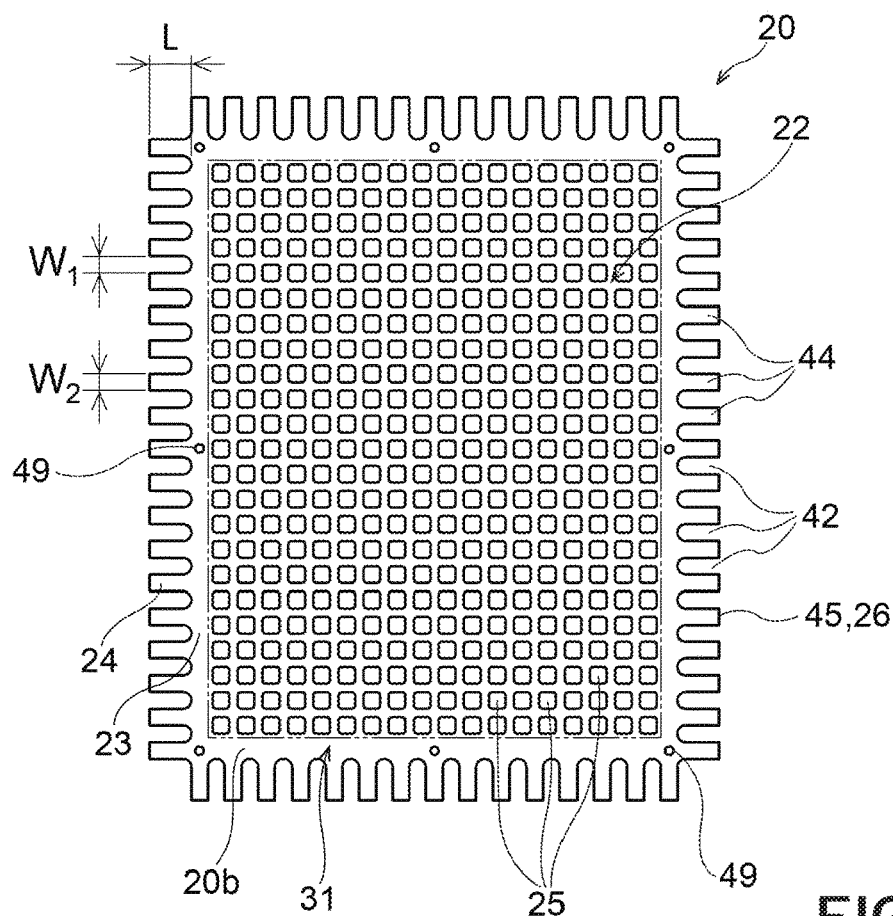
FIG. 29 is a plan view of a vapor deposition mask of the vapor deposition mask device shown in FIG. 26.

Next, another modification of the vapor deposition mask device 10 will be described with reference to FIGS. 26 to 30. FIG. 26 is a plan view of the vapor deposition mask device 10 according to the present modification, FIG. 27 is an enlarged partial plan view of part of the vapor deposition mask device 10 in an enlarged manner, and is a diagram showing a portion enclosed by the dashed-dotted line marked by XXVII in FIG. 26, FIG. 28 is a diagram showing the vapor deposition mask device 10 in a cross section taken along line XXVIII-XXVIII in FIG. 27, FIG. 29 is a plan view of the vapor deposition mask 20 of the vapor deposition mask device 10, and FIG. 30 is a plan view of a frame 80 of the vapor deposition mask device 10.

The vapor deposition mask device 10 shown in FIG. 26 includes a vapor deposition mask 20 having a substantially rectangular shape in plan view, and the frame 80 attached to the periphery of the vapor deposition mask 20. The vapor deposition mask device 10 has a plurality of vapor deposition masks 20. The plurality of vapor deposition masks 20 is arranged parallel to a plate face of a second frame 82, described later, of the frame 80 and along two directions crossing each other. Especially in the illustrated example, the plurality of vapor deposition masks 20 is arranged along two directions orthogonal to each other. Each vapor deposition mask 20 has one effective region 22. Each vapor deposition mask 20 corresponds to the display region of one organic EL display device. Therefore, according to the illustrated vapor deposition mask device 10, the multifaceted vapor deposition of the organic EL display device is possible corresponding to each vapor deposition mask 20. In the illustrated example, the vapor deposition mask 20 includes a metal layer 31 and the plurality of first through holes 25 formed in the metal layer 31. The thickness of the vapor deposition mask 20 can be 2.5 μm or more and 30 μm or less as an example.

Figure 27:
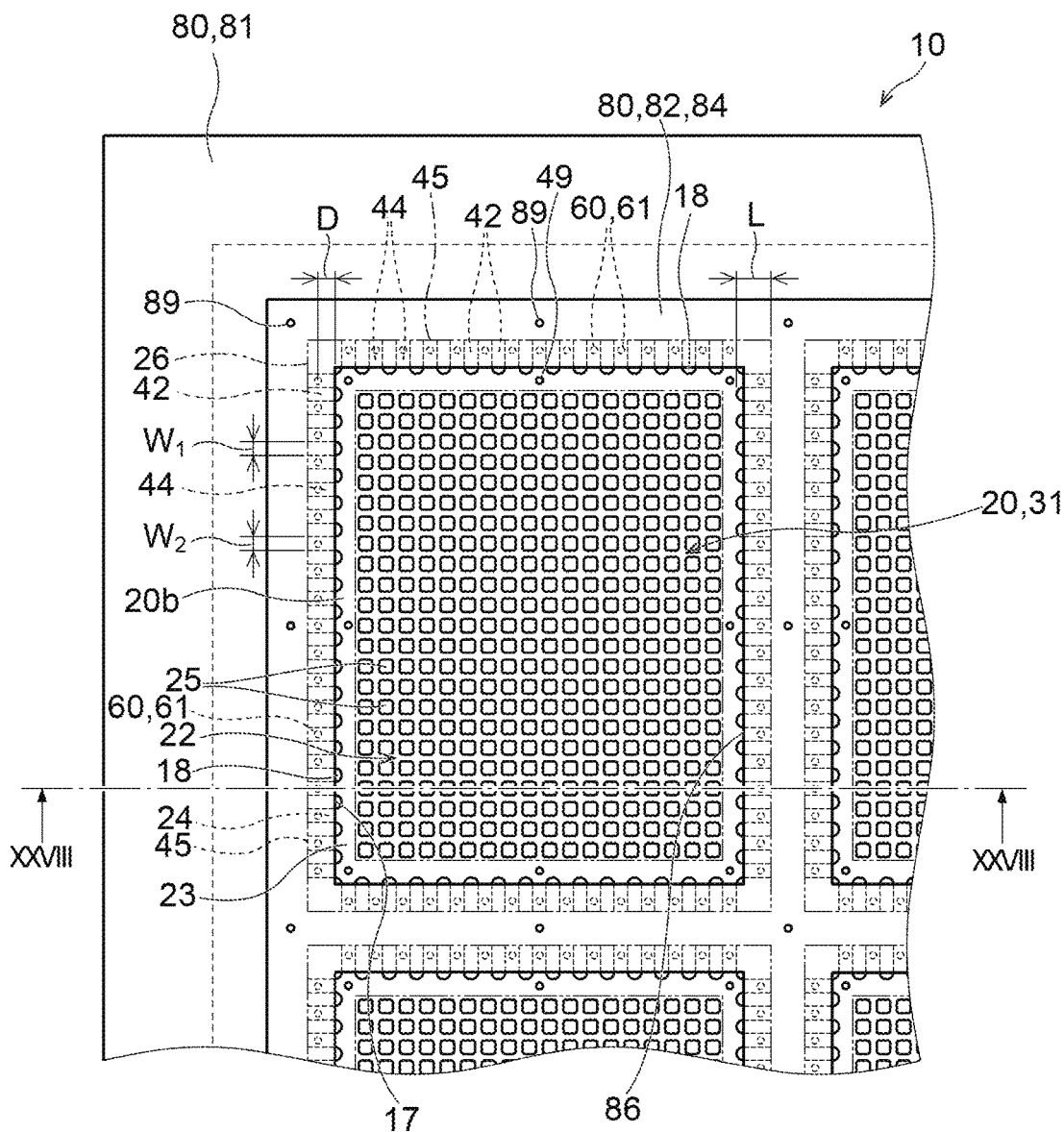
FIG. 27 is an enlarged partial plan view of part of the vapor deposition mask device shown in FIG. 26.
Figure 30:
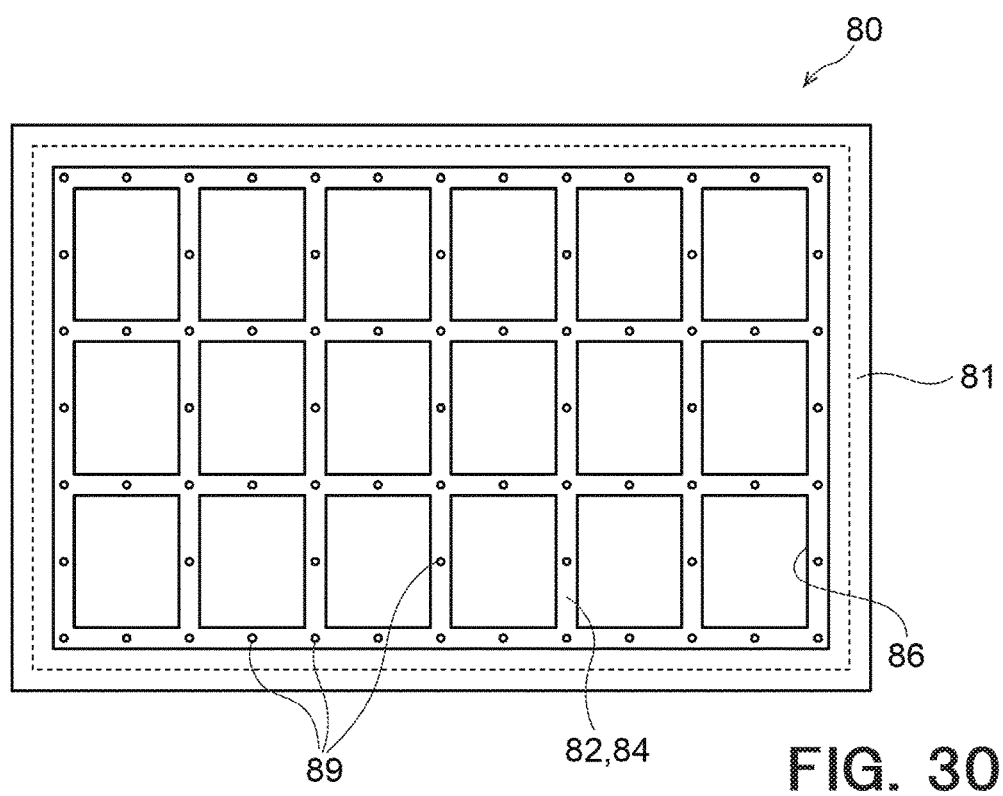
FIG. 30 is a plan view of a frame of the vapor deposition mask device shown in FIG. 26.

As shown in FIGS. 26, 27 and 30, the frame 80 includes a first frame 81 and the second frame 82 attached to the first frame 81. The second frame 82 has a substantially rectangular shape in plan view, and more precisely, a substantially rectangular outline in plan view. The first frame 81 is formed in a substantially rectangular frame shape, and the second frame 82 is attached to the first frame 81 so that each side of the second frame 82 corresponds to each side of the first frame 81.

The second frame 82 includes a plate member 84 and a plurality of openings 86 formed in the plate member 84. The plurality of openings 86 is arranged along two directions crossing each other. Especially in the illustrated example, the plurality of openings 86 is arranged along two directions orthogonal to each other. In the vapor deposition mask device 10 of the present modification, one vapor deposition mask 20 is attached corresponding to one opening 86 of the second frame 82. The thickness of the second frame 82 can be, for example, 50 μm or more and 500 μm or less.

As shown in the drawing, the opening 86 of the second frame 82 has, for example, a substantially quadrilateral shape in plan view, and more precisely, a substantially rectangular outline in plan view. Although not shown, each opening 86 can have outlines of various shapes corresponding to the shape of the display region of the substrate to be vapor-deposited (organic EL substrate) 92. For example, each opening 86 may have a circular outline. Although FIG. 26, FIG. 27 and FIG. 30 show that the respective openings 86 have the same plan view shape with each other, the disclosure is not limited thereto, and the openings 86 may have different opening shapes. In other words, the second frame 82 may have a plurality of openings 86 having shapes different from each other in plan view.

The first through hole 25 of the vapor deposition mask 20 has a planar size smaller than a planar size of the opening 86 of the second frame 82. Here, the fact that the first through hole 25 has the planar size smaller than the planar size of the opening 86 means that the size of the first through holes 25 is smaller than the size of the opening 86 in all directions along the plate face of the second frame 82 (the plate face of the vapor deposition mask 20). As a result, in the example shown in FIG. 27, the outline defining the opening 86 surrounds the outline defining the first through hole 25 located in the opening 86 in plan view. The maximum dimension of the first through hole 25 in the planar direction can be, for example, 5 μm or more and 100 μm or less. The first through hole 25 may have a slit shape having a longitudinal direction and a width direction orthogonal to the longitudinal direction in plan view. In this case, the maximum width along the width direction of the first through hole 25 can be, for example, 5 μm or more and 100 μm or less.

The vapor deposition mask 20 and the second frame 82 are fixed to each other. Therefore, the vapor deposition mask device 10 includes a plurality of first joint portions 61 (joint portions 60) that joins the second frame 82 and the vapor deposition mask 20 to each other. The first frame 81 and the second frame 82 are fixed to each other. Therefore, the vapor deposition mask device 10 includes a plurality of second joint portions 62 that joins the first frame 81 and the second frame 82 to each other. As an example, each of the first joint portion 61 and the second joint portion 62 may be constituted as a weld portion by spot welding.

In the example shown in FIG. 26, FIG. 27 and FIG. 29, a plurality of alignment marks 49 is provided in the vicinity of the outer periphery of the effective region 22 of the vapor deposition mask 20. In the example shown in FIG. 26, FIG. 27 and FIG. 30, a plurality of alignment marks 89 is provided in the vicinity of each opening 86 of the second frame 82. In the illustrated example, some (for example, two) alignment marks are shared between the adjacent openings 86. The alignment marks 49 and 89 are used to align the relative position between the vapor deposition mask 20 and the second frame 82 at a predetermined position when attaching the vapor deposition mask 20 to the second frame 82. The specific shape of the alignment marks 49 and 89 may be any shape that can be recognized by an imaging device such as a camera, and is not particularly limited.

Next, an example of the method of manufacturing the vapor deposition mask device 10 in this modification is described.

[Patterned Substrate Preparation Process]

The patterned substrate described with reference to FIG. 10 is prepared.

[Film Forming Process]

Next, a film forming process of forming the metal layer 31 on the conductive pattern is performed. In the film forming process, the metal layer 31 having the first through holes 25 is formed on the conductive pattern. Specifically, a plating solution is supplied on the base material on which the conductive pattern is formed to perform a plating treatment process of depositing the metal layer 31 on the conductive pattern. As a result, the metal layer 31 which will later form the vapor deposition mask 20 can be formed on the conductive pattern. The details of the film forming process are the same as the first film forming process and the second film forming process described above, and thus the description thereof is omitted here.

[Cutting Process]

Next, a cutting process of cutting the patterned substrate and the metal layer 31 is performed at a position where the outer edge 26 of the vapor deposition mask 20 is to be formed.

[Frame Preparation Process]

The frame 80 including the first frame 81 and the second frame 82 is prepared. For the first frame 81, the second frame 82 is attached to the first frame 81 by spot welding the second frame 82 at a plurality of points at its peripheral portion. Thus, the second frame 82 is joined to the first frame 81 via the plurality of second joint portions 62.

[Joining Step]

Next, a joining step of joining the metal layer 31 to the second frame 82 is performed. In the joining step, the metal layer 31 of the laminate including the base material, the conductive pattern provided on the base material, and the metal layer 31 provided on opposite side, with respect to the base material, of the conductive pattern are joined to the second frame 82 at the plurality of first joint portions 61. Especially in the present modification, the joint piece 44 in the laminate is joined to the second frame 82. The metal layer 31 and the second frame 82 are fixed to each other by spot welding. In particular, the metal layer 31 and the second frame 82 are fixed to each other by laser spot welding.

Specifically, first, while recognizing the alignment marks 49 and 89 by an imaging device such as a camera, the stack and the second frame 82 are disposed so that the metal layer 31 is aligned with the corresponding opening 86 of the second frame 82, and the joint piece 44 of the metal layer 31 and the second frame 82 contact each other. Next, the joint piece 44 is irradiated with the laser light through the base material from the base material side to melt part of the joint piece 44 and part of the second frame 82 by the heat generated by the irradiation with the laser light, and the joint piece 44 and the second frame 82 are fixed by welding. As a result, the first joint portion 61 that joins the joint piece 44 and the second frame 82 is formed.

[Separation Step]

Next, a separation step of separating the base material from the metal layer 31 is performed. In the separation step, first, the combination of the frame 80, the metal layer 31, the conductive pattern, and the base material is immersed in an etching solution capable of selectively etching the conductive pattern. Next, the base material 51 is peeled off and separated from the metal layer 31. Thereafter, the metal layer 31 is again immersed in the above-mentioned etching solution, and the conductive pattern attached to and remaining on the metal layer 31 is completely removed by etching.

By repeating the above-described joining step and separation step for a plurality of metal layers 31, the vapor deposition mask device 10 including a plurality of vapor deposition masks 20 can be manufactured. The disclosure is not limited thereto, and the above-described joining step may be repeated for a plurality of metal layers 31, and the above-mentioned separation step may be collectively performed on the plurality of metal layers 31 joined to the second frame 82.

The vapor deposition mask device 10 of this modification includes the frame 80 and a plurality of vapor deposition masks 20 attached to the frame 80, wherein the frame 80 includes the frame-shaped first frame 81, and the plate-like second frame 82 attached to the first frame 81, the plurality of openings 86 is formed in the second frame 82, and each vapor deposition mask 20 is attached to the second frame 82 corresponding to each opening 86.

In the vapor deposition mask device 10 of the present modification, the vapor deposition mask 20 has a plurality of first through holes 25, and the planar size of the first through hole 25 is smaller than the planar size of the opening 86.

According to the vapor deposition mask device 10, a plurality of vapor deposition masks 20 can be individually made and attached to the frame 80, so that the yield of the vapor deposition mask device 10 can be improved.

According to the vapor deposition mask device 10, the planar view size (planar size) of each vapor deposition mask 20 can be made relatively small, so that it is possible to effectively suppress the appearance defect such as folds and dents from occurring in the vapor deposition mask when the vapor deposition mask having a relatively large planar view size is conveyed in the manufacturing process of the vapor deposition mask device. Especially in the present modification, the vapor deposition mask 20 has one effective region 22 corresponding to one display region of the organic EL display device. As a result, the planar view size of each vapor deposition mask 20 can be largely reduced. Therefore, it is possible to more effectively suppress the appearance defects such as folds and dents from occurring in the vapor deposition mask when the vapor deposition mask is conveyed.

Next, a further modification of the vapor deposition mask device 10 including the frame 80 having the first frame 81 and the second frame 82 will be described. In the following description and the drawings used in the following description, the same reference signs as those used for the corresponding parts in the above-described modifications are used for parts that can be configured as in the above-described modifications with reference to FIGS. 26 to 30, and duplicate explanation may be omitted. In the case where it is clear that the effects and advantages obtained in the above-described modification can be obtained also in the modification relating to the following description, the description may be omitted.

Figure 31:
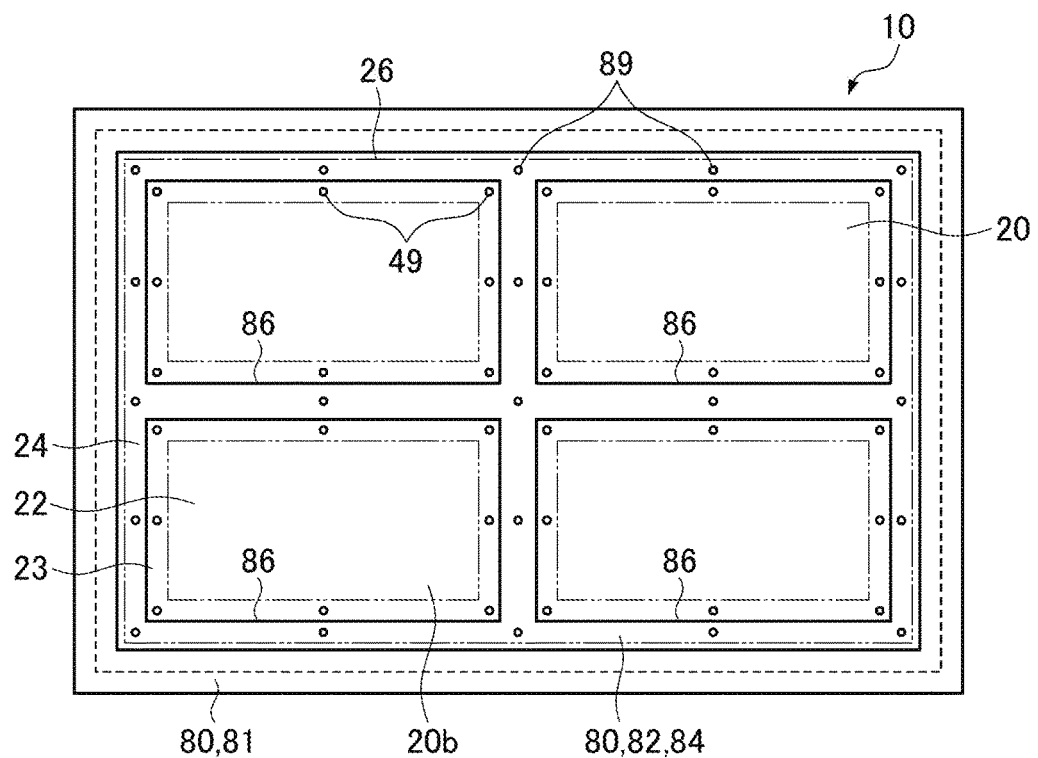
FIG. 31 is a plan view of still another modification of the vapor deposition mask device.
Figure 32:
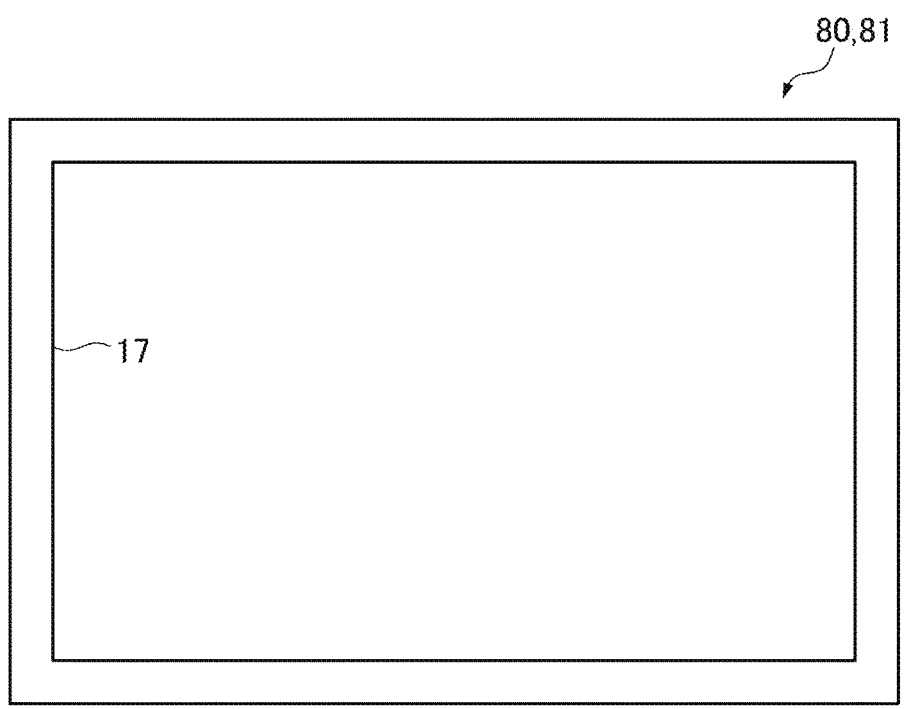
FIG. 32 is a plan view of a first frame of the vapor deposition mask device shown in FIG. 31.
Figure 33:
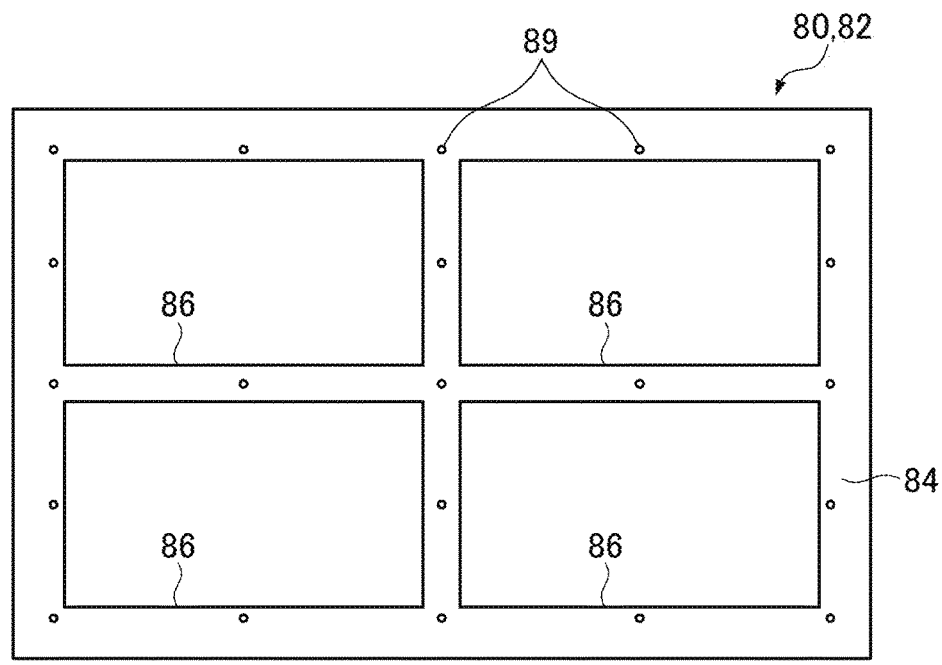
FIG. 33 is a plan view of a second frame of the vapor deposition mask device shown in FIG. 31.
Figure 34:
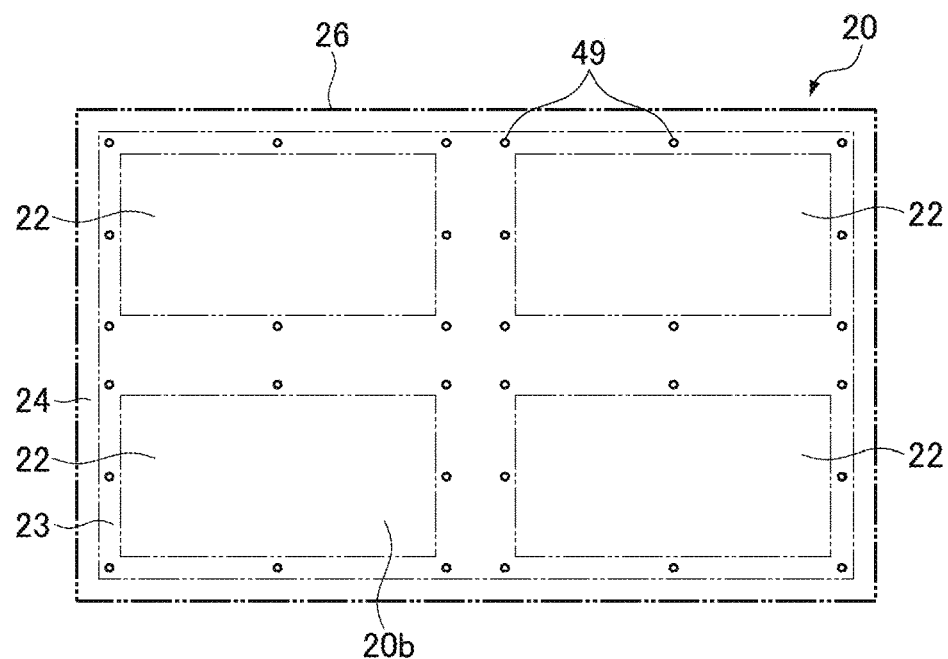
FIG. 34 is a plan view of a vapor deposition mask of the vapor deposition mask device shown in FIG. 31.

FIGS. 31 to 34 are diagrams for explaining still another modification of the vapor deposition mask device 10. Among these, FIG. 31 is a plan view of the vapor deposition mask device 10 according to the present modification, FIG. 32 is a plan view of the first frame 81 of the vapor deposition mask device 10, FIG. 33 is a plan view of the second frame 82 of the vapor deposition mask device 10, and FIG. 34 is a plan view of the vapor deposition mask 20 of the vapor deposition mask device 10.

The vapor deposition mask device 10 shown in FIG. 31 includes a vapor deposition mask 20 having a substantially rectangular shape in plan view, and the frame 80 attached to the vapor deposition mask 20. The frame 80 includes the first frame 81 and the second frame 82 attached to the first frame 81.

The second frame 82 includes a plate member 84 and a plurality of openings 86 formed in the plate member 84. The plurality of openings 86 is arranged along two directions crossing each other. Especially in the illustrated example, the plurality of openings 86 is arranged along two directions orthogonal to each other.

The first frame 81 and the second frame 82 are fixed to each other. Therefore, the vapor deposition mask device 10 has a plurality of second joint portions that joins the first frame 81 and the second frame 82 to each other. However, in FIG. 31, the illustration of the second joint portion is omitted.

The vapor deposition mask 20 is attached to the second frame 82 so as to cover the plurality of openings 86 of the second frame 82. Especially in the illustrated example, the vapor deposition mask 20 covers all the openings 86 of the second frame 82. The vapor deposition mask device 10 has a plurality of first joint portions (joint portions) that joins the second frame 82 and the vapor deposition mask 20 to each other. However, in FIG. 31, the illustration of the first joint portion is omitted. A plurality of first through holes is formed in the effective region 22 of the vapor deposition mask 20. The shape and arrangement pattern of the first through holes may be formed, for example, in the same manner as the example described above with reference to FIGS. 3 to 6, 23 and 27 to 29. Therefore, in FIG. 31 and FIG. 34, the illustration of the first through holes is omitted.

The vapor deposition mask device 10 of this modification includes the frame 80 and the vapor deposition mask 20 attached to the frame 80, wherein the frame 80 includes the frame-shaped first frame 81 and the plate-like second frame 82 attached to the first frame 81, a plurality of openings 86 is formed in the second frame 82, and each vapor deposition mask 20 is attached to the second frame 82 covering a plurality of opening 86.

As described above with reference to FIG. 2, in a case in which vapor deposition of the vapor deposition material 98 onto the substrate to be vapor-deposited is performed in the vapor deposition apparatus 90 using this vapor deposition mask device 10, when the vapor deposition mask 20 has a relatively large size to cover the plurality of openings 86, the vapor deposition mask 20 may bends downward due to the action of gravity, and even if the magnet 93 is used, the vapor deposition mask 20 may not sufficiently come close contact with the substrate to be vapor-deposited. On the contrary, according to the vapor deposition mask device 10 of the present modification, even if the vapor deposition mask 20 has a relatively large size, the second frame 82 supports the vapor deposition mask 20 from below, and the downward bending of the vapor deposition mask 20 due to the action of gravity can be reduced. The second frame 82 attracted to the substrate to be vapor-deposited by the magnetic force of the magnet 93 can press the vapor deposition mask 20 against the substrate to be vapor-deposited, whereby, the close contact of the vapor deposition mask 20 to the substrate to be vapor-deposited can be effectively improved.

Figure 35:
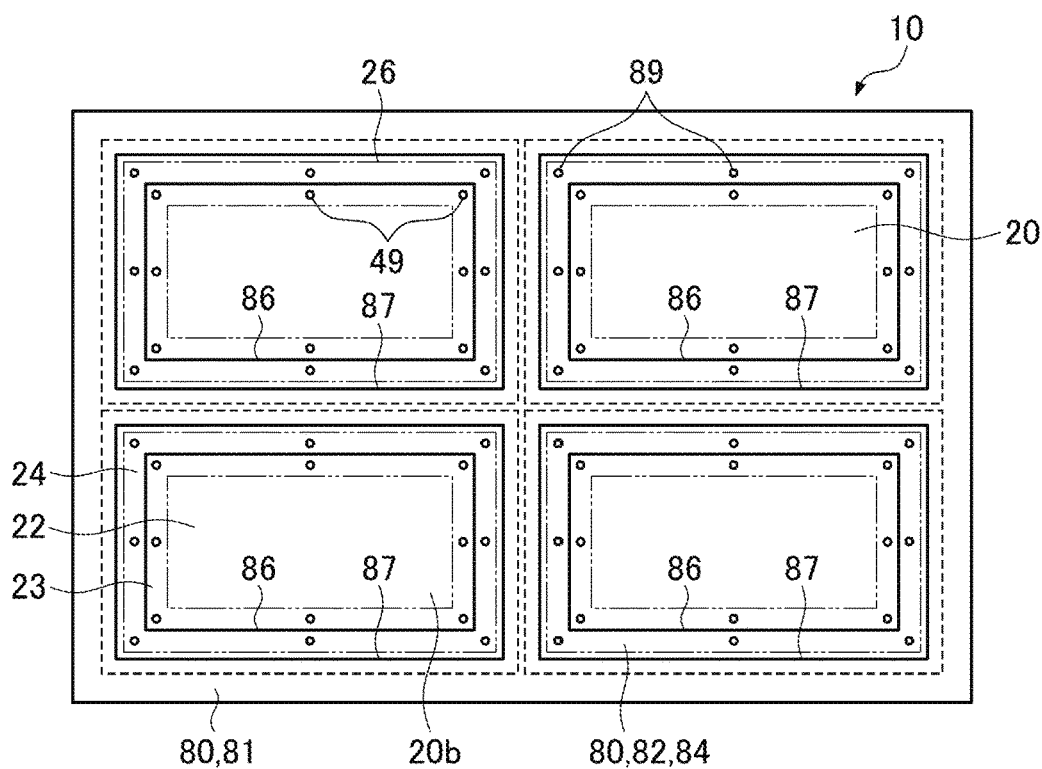
FIG. 35 is a plan view of still another modification of the vapor deposition mask device.
Figure 36:
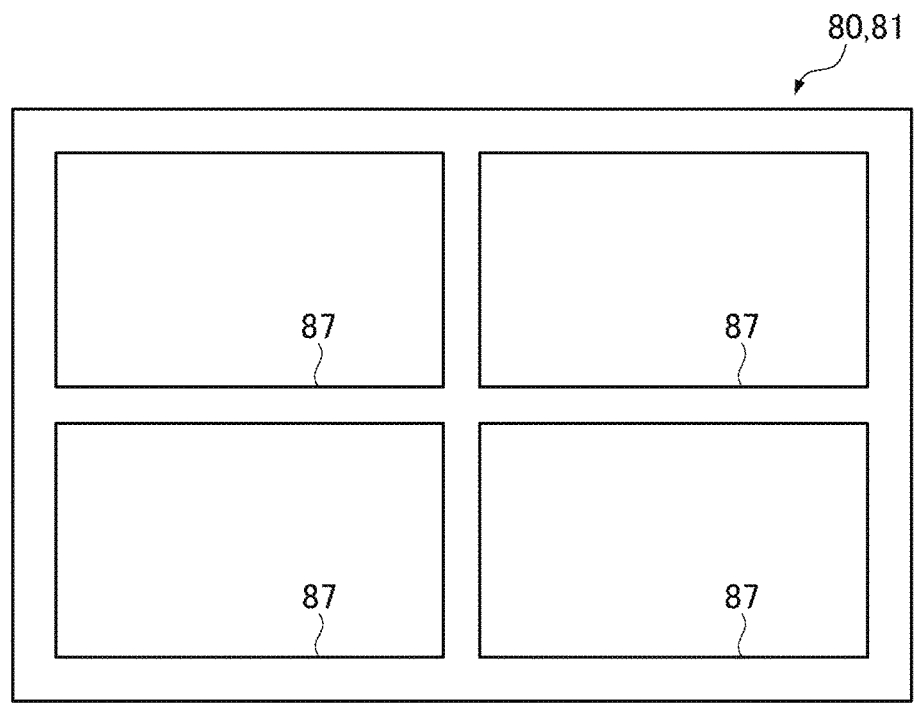
FIG. 36 is a plan view of a first frame of the vapor deposition mask device shown in FIG. 35.
Figure 37:
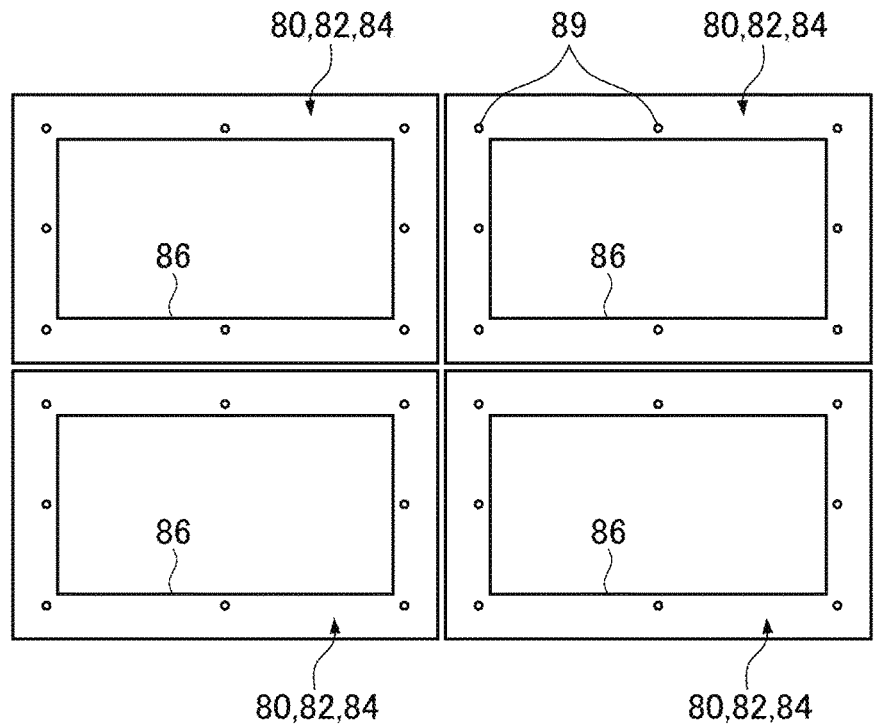
FIG. 37 is a plan view of a second frame of the vapor deposition mask device shown in FIG. 35.
Figure 38:
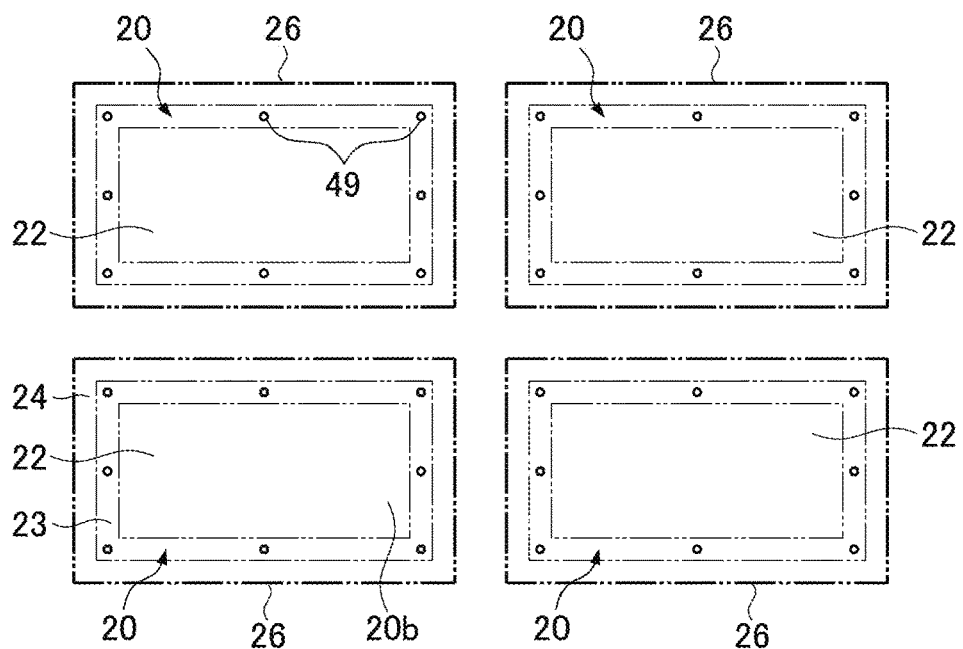
FIG. 38 is a plan view of a vapor deposition mask of the vapor deposition mask device shown in FIG. 35.

FIGS. 35 to 38 are diagrams for explaining still another modification of the vapor deposition mask device 10. Among these, FIG. 35 is a plan view of the vapor deposition mask device 10 according to the present modification, FIG. 36 is a plan view of the first frame 81 of the vapor deposition mask device 10, FIG. 37 is a plan view of the second frame 82 of the vapor deposition mask device 10, and FIG. 38 is a plan view of the vapor deposition mask 20 of the vapor deposition mask device 10.

The vapor deposition mask device 10 shown in FIG. 35 includes the frame 80 and the plurality of vapor deposition masks 20 attached to the frame 80. The frame 80 includes the first frame 81 and the plurality of second frames 82 attached to the first frame 81.

The first frame 81 includes a main body 87 and a plurality of openings 88 formed in the main body 87. In the illustrated example, the plurality of openings 88 is arranged along two directions crossing each other. In particular, the plurality of openings 88 is arranged along two directions orthogonal to each other.

The second frame 82 includes the plate member 84 and the opening 86 formed in the plate member 84. In particular, the second frame 82 has one opening 86 formed in the plate member 84. Each second frame 82 is provided corresponding to the opening 88 of the first frame 81. That is, one second frame 82 is provided corresponding to one opening 88. The opening 86 of the second frame 82 overlaps the opening 88 of the first frame 81 corresponding to the second frame 82 in plan view. In particular, the planar size of the opening 86 of the second frame 82 is smaller than the planar size of the opening 88 of the first frame 81. In the illustrated example, the opening 86 of the second frame 82 is located inside the opening 88 of the corresponding first frame 81 in plan view.

The plurality of vapor deposition masks 20 is arranged parallel to the plate face of the second frame 82 and along two directions crossing each other. Especially in the illustrated example, the plurality of vapor deposition masks 20 is arranged along two directions orthogonal to each other. A plurality of first through holes is formed in the effective region 22 of the vapor deposition mask 20. The shape and arrangement pattern of the first through holes may be formed, for example, in the same manner as the example described above with reference to FIGS. 3 to 6, 23 and 27 to 29. Therefore, in FIG. 35 and FIG. 38, the illustration of the first through holes is omitted.

The vapor deposition mask 20 and the second frame 82 are fixed to each other. Therefore, the vapor deposition mask device 10 includes a plurality of first joint portions that joins the vapor deposition mask 20 and the second frame 82 to each other. The first frame 81 and the second frame 82 are fixed to each other. Therefore, the vapor deposition mask device 10 has a plurality of second joint portions that joins the first frame 81 and the second frame 82 to each other. However, in FIG. 35, the illustration of the first joint portion and the second joint portion is omitted.

The vapor deposition mask device 10 of this modification includes the frame 80 and the plurality of vapor deposition masks 20 attached to the frame 80, wherein the frame 80 includes the first frame 81 and the plurality of plate-like second frames 82 attached to the first frame 81, the plurality of openings 88 is formed in the first frame 81, the opening 86 is formed each second frame 82, each second frame 82 is disposed corresponding to the opening 88 of the first frame 81, and each vapor deposition mask 20 is attached to the second frame 82 covering the opening 86.

According to this modification, while the same effects as the effects of the modification described above is achieved with reference to FIGS. 26 to 30, each second frame 82 can be independently aligned with the first frame 81, so that the alignment of each second frame 82 with the first frame 81 can be performed with high accuracy. A plurality of second frames 82 can be individually made and attached to the first frame 81, so that the yield of the vapor deposition mask device 10 can be improved.

Figure 39:
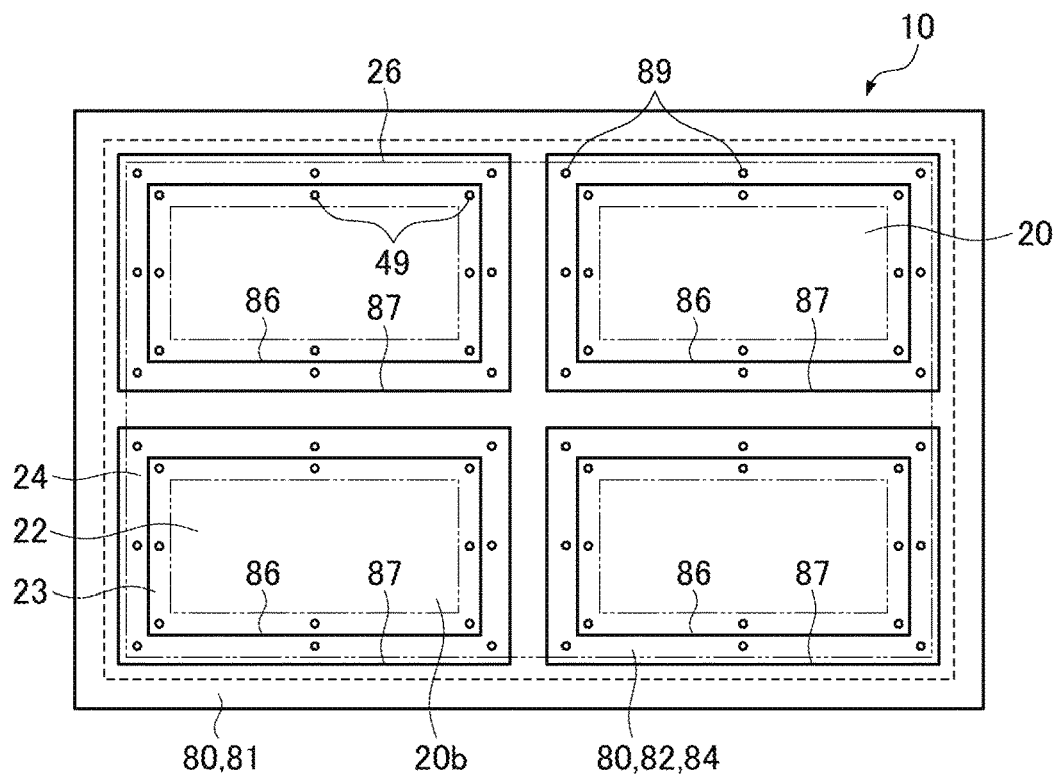
FIG. 39 is a plan view of still another modification of the vapor deposition mask device.
Figure 40:
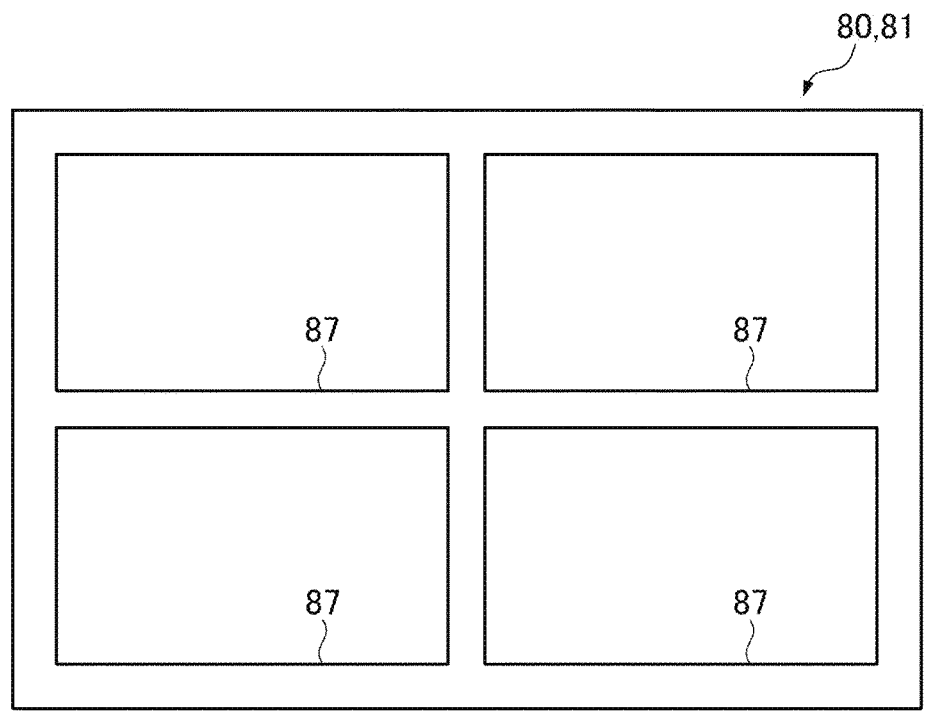
FIG. 40 is a plan view of a first frame of the vapor deposition mask device shown in FIG. 39.
Figure 41:
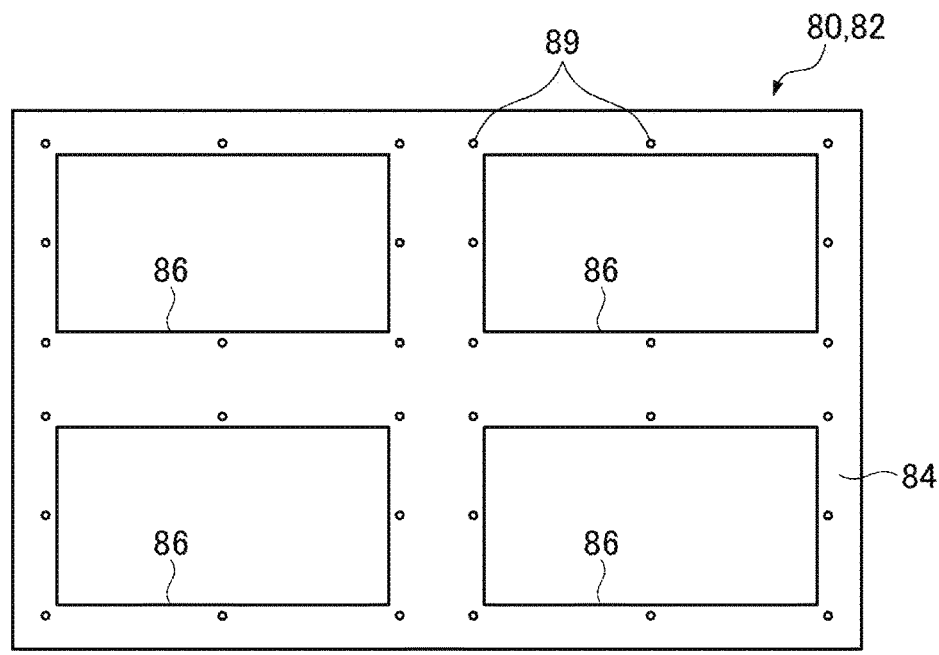
FIG. 41 is a plan view of a second frame of the vapor deposition mask device shown in FIG. 39.
Figure 42:
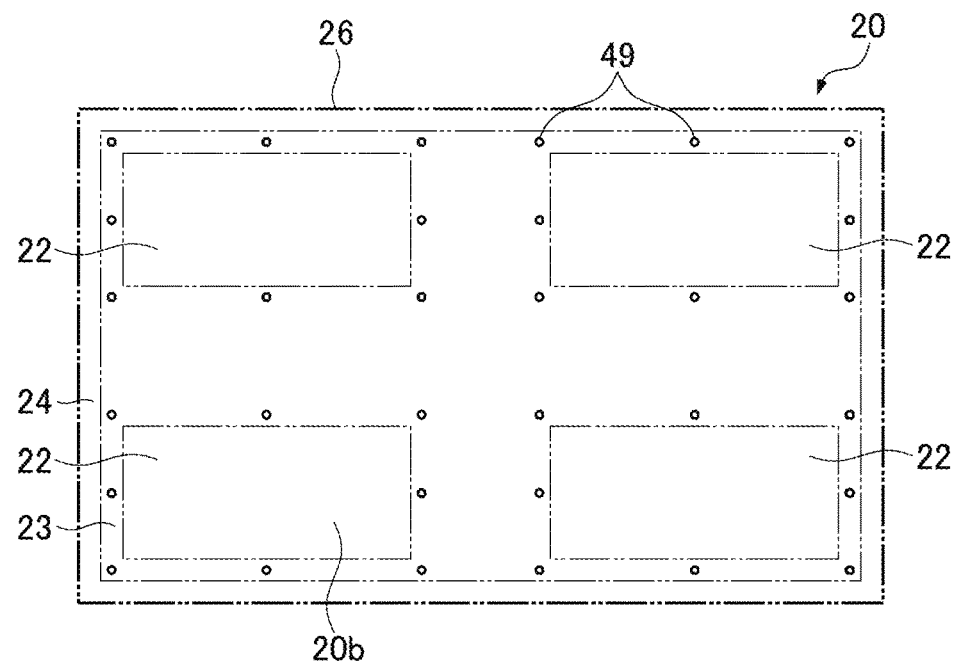
FIG. 42 is a plan view of a vapor deposition mask of the vapor deposition mask device shown in FIG. 39.

FIGS. 39 to 42 are diagrams for describing still another modification of the vapor deposition mask device 10. Among these, FIG. 39 is a plan view of the vapor deposition mask device 10 according to the present modification, FIG. 40 is a plan view of the first frame 81 of the vapor deposition mask device 10, FIG. 41 is a plan view of the second frame 82 of the vapor deposition mask device 10, and FIG. 42 is a plan view of the vapor deposition mask 20 of the vapor deposition mask device 10.

The vapor deposition mask device 10 shown in FIG. 39 includes the frame 80 and the vapor deposition mask 20 attached to the frame 80. The frame 80 includes the first frame 81 and the second frame 82 attached to the first frame 81.

The first frame 81 includes the main body 87 and the plurality of openings 88 formed in the main body 87. In the illustrated example, the plurality of openings 88 is arranged along two directions crossing each other. In particular, the plurality of openings 88 is arranged along two directions orthogonal to each other.

The second frame 82 includes a plate member 84 and a plurality of openings 86 formed in the plate member 84. The plurality of openings 86 is arranged along two directions crossing each other. Especially in the illustrated example, the plurality of openings 86 is arranged along two directions orthogonal to each other. Each opening 86 is provided corresponding to the opening 88 of the first frame 81. That is, one opening 86 of the second frame 82 is provided corresponding to one opening 88 of the first frame 81. The opening 86 of the second frame 82 overlaps the opening 88 of the first frame 81 corresponding to the second frame 82 in plan view. In particular, the planar size of the opening 86 of the second frame 82 is smaller than the planar size of the opening 88 of the first frame 81. In the illustrated example, the opening 86 of the second frame 82 is located inside the opening 88 of the corresponding first frame 81 in plan view.

The vapor deposition mask 20 has a plurality of effective regions 22. The plurality of effective regions 22 is arranged parallel to the plate face of the second frame 82 and along two directions crossing each other. Especially in the illustrated example, the plurality of effective regions 22 is arranged along two directions orthogonal to one another. A plurality of first through holes is formed in the effective region 22. The shape and arrangement pattern of the first through holes may be formed, for example, in the same manner as the example described above with reference to FIGS. 3 to 6, 23 and 27 to 29. Therefore, in FIG. 39 and FIG. 42, the illustration of the first through holes is omitted.

The vapor deposition mask 20 and the second frame 82 are fixed to each other. Therefore, the vapor deposition mask device 10 includes a plurality of first joint portions that joins the vapor deposition mask 20 and the second frame 82 to each other. The first frame 81 and the second frame 82 are fixed to each other. Therefore, the vapor deposition mask device 10 has a plurality of second joint portions that joins the first frame 81 and the second frame 82 to each other. However, in FIG. 39, the illustration of the first joint portion and the second joint portion is omitted.

The vapor deposition mask device 10 of this modification includes the frame 80 and the vapor deposition mask 20 attached to the frame 80, wherein the frame 80 includes the first frame 81 and the plate-like second frame 82 attached to the first frame 81, the plurality of openings 88 is formed in the first frame 81, the plurality of openings 86 is formed in the second frame 82, each opening 86 of the second frame 82 is disposed corresponding to each opening 88 of the first frame 81, and each vapor deposition mask 20 is attached to the second frame 82 covering the plurality of openings 86.

According to this modification, the same effects as the effects of the modification described above with reference to FIGS. 31 to 34 can be obtained, and the first frame 81, in addition to the second frame 82, supports the vapor deposition mask 20 from below, even if the vapor deposition mask 20 has a relatively large size, so that the downward bending of the vapor deposition mask 20 due to the action of gravity can be further reduced. As a result, the close contact of the vapor deposition mask 20 to the substrate to be vapor-deposited can be further effectively improved.

Figure 43:
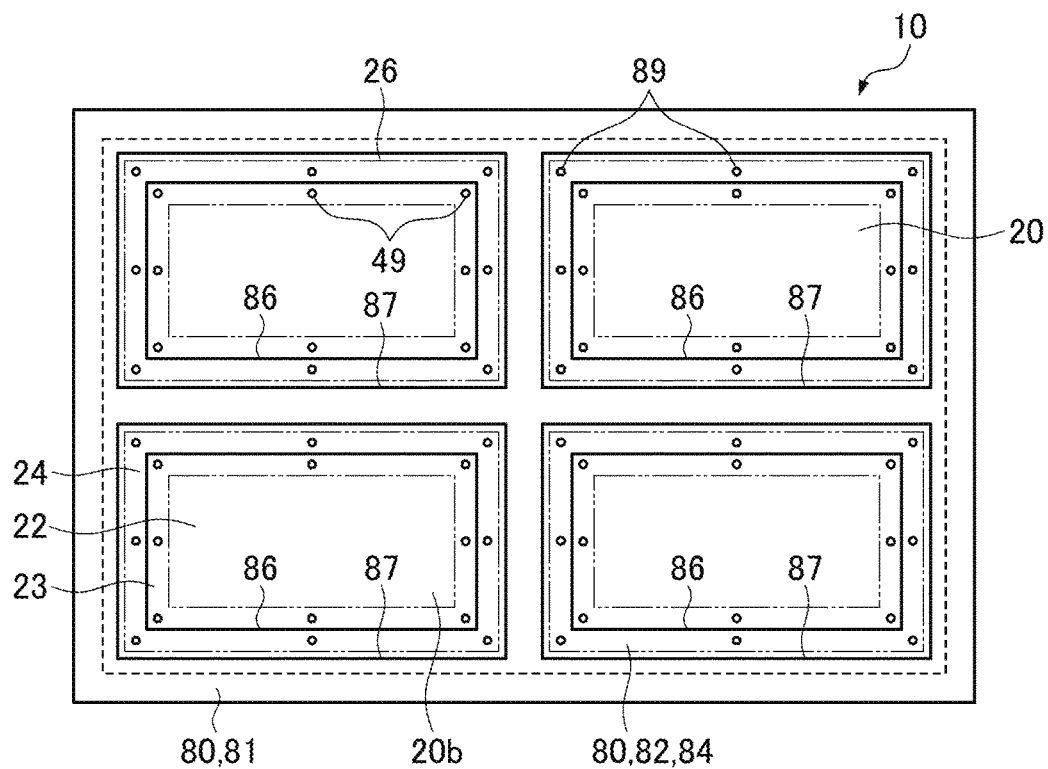
FIG. 43 is a plan view of still another modification of the vapor deposition mask device.
Figure 44:
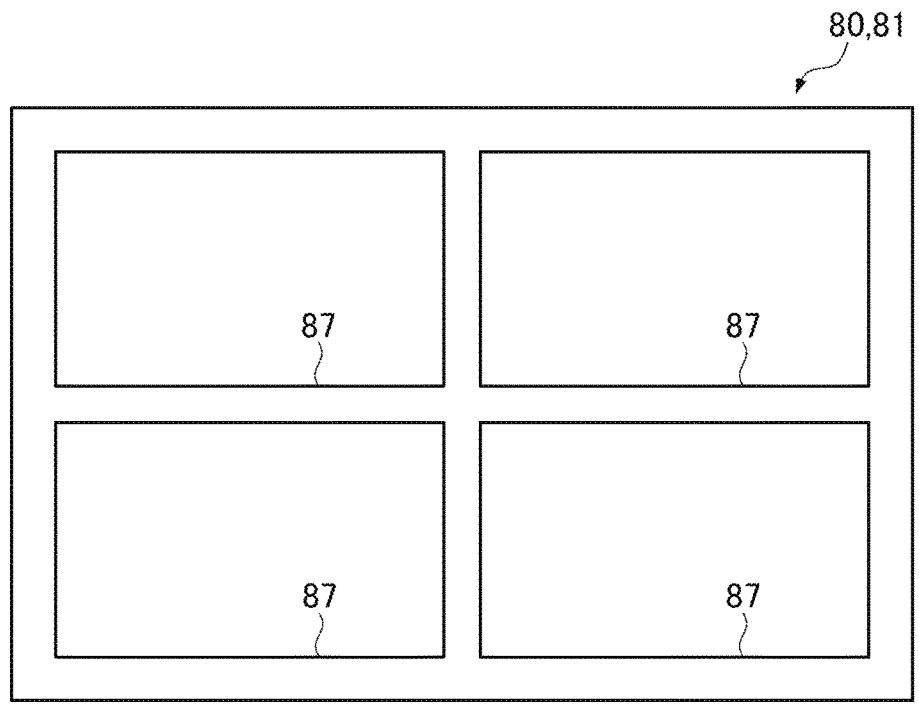
FIG. 44 is a plan view of a first frame of the vapor deposition mask device shown in FIG. 43.
Figure 45:
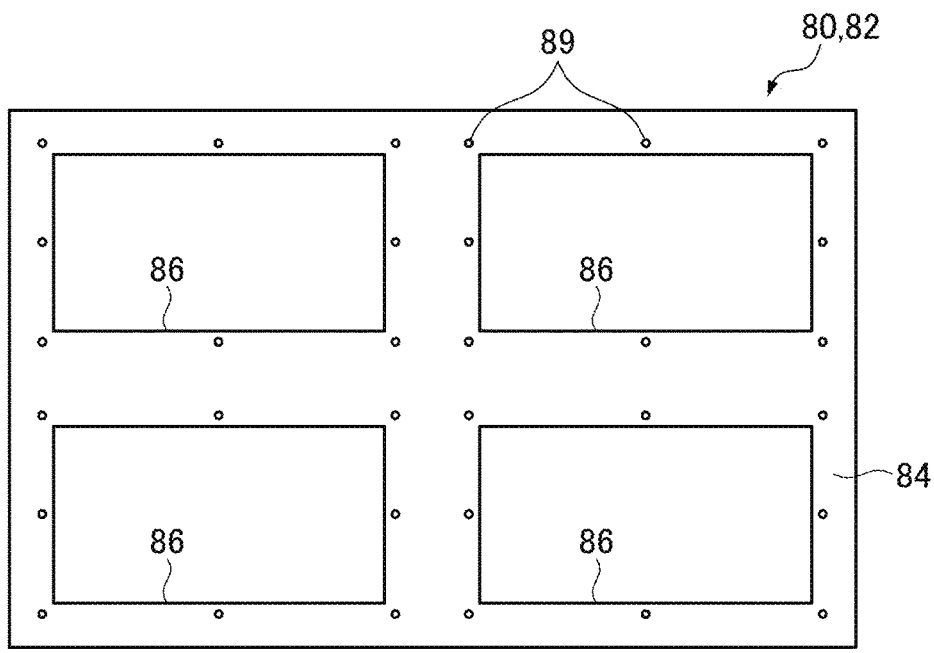
FIG. 45 is a plan view of a second frame of the vapor deposition mask device shown in FIG. 43.
Figure 46:
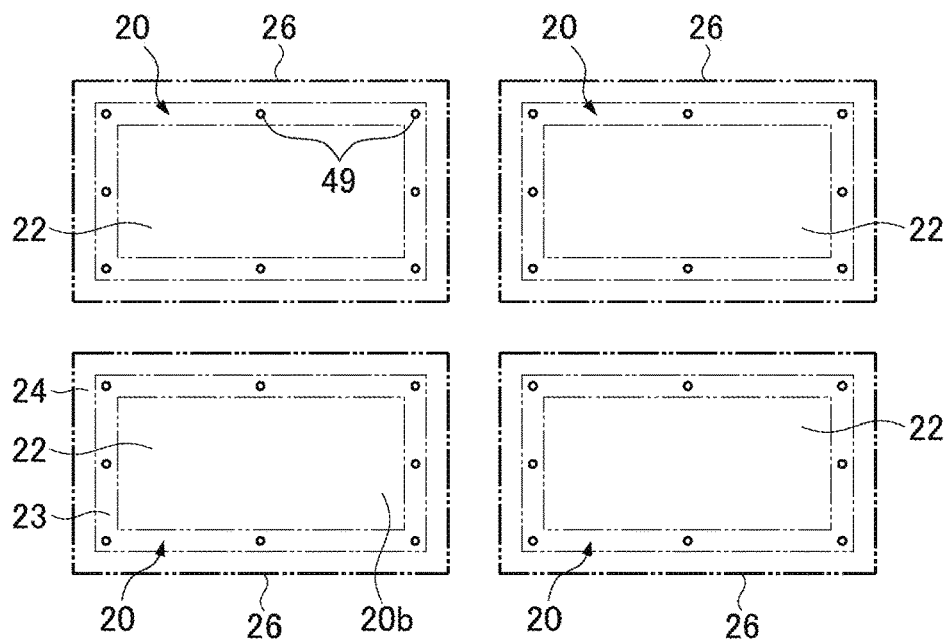
FIG. 46 is a plan view of a vapor deposition mask of the vapor deposition mask device shown in FIG. 43.

FIGS. 43 to 46 are diagrams for describing still another modification of the vapor deposition mask device 10. Among these, FIG. 43 is a plan view of the vapor deposition mask device 10 according to the present modification, FIG. 44 is a plan view of the first frame 81 of the vapor deposition mask device 10, FIG. 45 is a plan view of the second frame 82 of the vapor deposition mask device 10, and FIG. 46 is a plan view of the vapor deposition mask 20 of the vapor deposition mask device 10.

The vapor deposition mask device 10 shown in FIG. 43 includes the frame 80 and the plurality of vapor deposition masks 20 attached to the frame 80. The frame 80 includes the first frame 81 and the second frame 82 attached to the first frame 81.

The first frame 81 includes the main body 87 and the plurality of openings 88 formed in the main body 87. In the illustrated example, the plurality of openings 88 is arranged along two directions crossing each other. In particular, the plurality of openings 88 is arranged along two directions orthogonal to each other.

The second frame 82 includes a plate member 84 and a plurality of openings 86 formed in the plate member 84. The plurality of openings 86 is arranged along two directions crossing each other. Especially in the illustrated example, the plurality of openings 86 is arranged along two directions orthogonal to each other. Each opening 86 is provided corresponding to the opening 88 of the first frame 81. That is, one opening 86 of the second frame 82 is provided corresponding to one opening 88 of the first frame 81. The opening 86 of the second frame 82 overlaps the opening 88 of the first frame 81 corresponding to the second frame 82 in plan view. In particular, the planar size of the opening 86 of the second frame 82 is smaller than the planar size of the opening 88 of the first frame 81. In the illustrated example, the opening 86 of the second frame 82 is located inside the opening 88 of the corresponding first frame 81 in plan view.

The plurality of vapor deposition masks 20 is arranged parallel to the plate face of the second frame 82 and along two directions crossing each other. Especially in the illustrated example, the plurality of vapor deposition masks 20 is arranged along two directions orthogonal to each other. A plurality of first through holes is formed in the effective region 22 of the vapor deposition mask 20. The shape and arrangement pattern of the first through holes may be formed, for example, in the same manner as the example described above with reference to FIGS. 3 to 6, 23 and 27 to 29. Therefore, in FIG. 43 and FIG. 46, the illustration of the first through holes is omitted.

The vapor deposition mask 20 and the second frame 82 are fixed to each other. Therefore, the vapor deposition mask device 10 includes a plurality of first joint portions that joins the vapor deposition mask 20 and the second frame 82 to each other. The first frame 81 and the second frame 82 are fixed to each other. Therefore, the vapor deposition mask device 10 has a plurality of second joint portions that joins the first frame 81 and the second frame 82 to each other. However, in FIG. 43, the illustration of the first joint portion and the second joint portion is omitted.

The vapor deposition mask device 10 of this modification includes the frame 80 and the plurality of vapor deposition masks 20 attached to the frame 80, wherein the frame 80 includes the first frame 81 and the plate-like second frame 82 attached to the first frame 81, the plurality of openings 88 is formed in the first frame 81, the plurality of openings 86 is formed in the second frame 82, each opening 86 of the second frame 82 is disposed corresponding to each openings 88 of the first frame 81, and each vapor deposition mask 20 is attached to the second frame 82 covering the plurality of openings 86.

According to this modification, while the same effects as the effects of the modification described above is achieved with reference to FIGS. 39 to 42, each vapor deposition mask 20 can be independently aligned with the frame 80 (the second frame 82), so that the alignment of each vapor deposition mask 20 with the frame 80 can be performed with high accuracy. A plurality of vapor deposition masks 20 can be individually made and attached to the frame 80, so that the yield of the vapor deposition mask device 10 can be improved.

According to the vapor deposition mask device 10, the planar view size (planar size) of each vapor deposition mask 20 can be made relatively small, so that it is possible to effectively suppress the appearance defect such as folds and dents from occurring in the vapor deposition mask when the vapor deposition mask having a relatively large planar view size is conveyed in the manufacturing process of the vapor deposition mask device. Especially in the present modification, the vapor deposition mask 20 has one effective region 22 corresponding to one display region of the organic EL display device. As a result, the planar view size of each vapor deposition mask 20 can be largely reduced. Therefore, it is possible to more effectively suppress the appearance defects such as folds and dents from occurring in the vapor deposition mask when the vapor deposition mask is conveyed.

In each of the modifications described above with reference to FIGS. 31 to 46, the notch is formed at a position corresponding to between two adjacent joint portions in the outer edge 26 of the vapor deposition mask 20, and a joint piece is formed between two adjacent notches, but in FIGS. 31 to 46, the illustration of the notch and the joint piece is omitted.

In each of the modifications described above with reference to FIGS. 26 to 46, the notch may extend beyond the outline of the opening 86 of the second frame 82 in plan view. As a result, a gap is formed between the end on the effective region 22 side of the notch and the outline of the opening 86. Therefore, in the separation step, the etching solution can be made to permeate through this gap from the outline side of the opening 86, so that the conductive pattern 52 located between the frame 80 (the second frame 82) and the base material 51 can be etched away more easily.

In the above description, some modifications to the above-described embodiment have been described. Naturally, however, it is also possible to combine plural modifications as appropriate.

The invention claimed is:

1. A vapor deposition mask device comprising:
a vapor deposition mask having an effective region in which a plurality of first through holes is arranged, a peripheral region surrounding the effective region in which a second plurality of through holes is arranged, and an ear region located at the periphery of the vapor deposition mask, wherein a thickness of the ear region is greater than a thickness of the effective region;
a frame attached to the vapor deposition mask at the ear region; and
a plurality of joint portions which join the vapor deposition mask and the frame together, wherein
the vapor deposition mask further includes a plurality of joint pieces, each in the ear region having the greater thickness where the vapor deposition mask and the frame are joined to each other,
the plurality of joint portions (i) are arranged along an outer edge of the vapor deposition mask, (ii) extend through a respective joint piece of the plurality of joint pieces, and (iii) are located at a distance of 0.5 mm or more and 2.5 mm or less from an inner edge of the frame in plan view,
a notch is formed, in the outer edge of the vapor deposition mask, at a position corresponding to between two of the joint portions which are adjacent, and
the notch extends beyond the inner edge of the frame in plan view of the vapor deposition mask.

2. The vapor deposition mask device according to claim 1, wherein the vapor deposition mask includes a plurality of notches, each individual notch located between two joint pieces that are adjacent to each other, wherein at the outer edge, each notch has a first width along a direction in which the outer edge extends, and each joint piece has a second width along the direction in which the outer edge extends, and the first width is larger than the second width.

3. The vapor deposition mask device according to claim 1, wherein the vapor deposition mask has a polygonal shape in plan view and a plurality of notches formed along one side of the polygonal shape.

4. The vapor deposition mask device according to claim 3, wherein
the vapor deposition mask device includes the plurality of notches, and
the plurality of notches includes two notches having shapes and/or dimensions different from each other in plan view of the vapor deposition mask.

5. The vapor deposition mask device according to claim 1, wherein the vapor deposition mask has, between the plurality of joint portions and the effective region, a plurality of third through holes that does not overlap the frame in plan view.

* * * * *